United States Patent
Ausserlechner

(10) Patent No.: US 9,711,712 B2
(45) Date of Patent: Jul. 18, 2017

(54) VERTICAL HALL DEVICE COMPRISING A SLOT IN THE HALL EFFECT REGION

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/962,879

(22) Filed: Dec. 8, 2015

(65) Prior Publication Data

US 2016/0093797 A1 Mar. 31, 2016

Related U.S. Application Data

(63) Continuation of application No. 13/531,076, filed on Jun. 22, 2012, now Pat. No. 9,222,991.

(51) Int. Cl.
*H01L 43/06* (2006.01)
*G01R 33/07* (2006.01)

(52) U.S. Cl.
CPC ............ *H01L 43/065* (2013.01); *G01R 33/07* (2013.01); *G01R 33/077* (2013.01)

(58) Field of Classification Search
CPC ....... H01L 43/065; H01L 43/04; H01L 43/06; G01R 33/075
See application file for complete search history.

(56) References Cited

U.S. PATENT DOCUMENTS

| | | | |
|---|---|---|---|
| 5,548,151 A | 8/1996 | Funaki et al. | |
| 7,782,050 B2* | 8/2010 | Ausserlechner | G01R 33/07 257/427 |
| 2010/0123458 A1* | 5/2010 | Schott | G01R 33/06 324/251 |

(Continued)

FOREIGN PATENT DOCUMENTS

EP 1438755 B1 1/2005

OTHER PUBLICATIONS

Popovic, R.S., "Hall Devices for Magnetic Sensor Microsystems," 1997 International Conference on Solid-State Sensors and Actuators, Jun. 16-19, 1997, pp. 377-380, IEEE, Chicago.

(Continued)

*Primary Examiner* — Kyoung Lee
*Assistant Examiner* — Christina Sylvia
(74) *Attorney, Agent, or Firm* — Slater Matsil, LLP

(57) ABSTRACT

A vertical Hall device includes a Hall effect region, a separator, a first plurality of contacts, and a second plurality of contacts. The Hall effect region includes a first straight section, a second straight section that is offset parallel to the first straight section, and a connecting section that connects the first straight section and the second straight section. The separator separates a portion of the first straight section from a portion of the second straight section. The first and second plurality of contacts are arranged in or at the surface of the first and second straight sections, respectively. With respect to a first clock phase of a spinning current scheme, the first plurality of contacts comprises a first supply contact and a first sense contact. The second plurality of contacts comprises a second supply contact and a second sense contact.

15 Claims, 21 Drawing Sheets

(56) References Cited

U.S. PATENT DOCUMENTS

2010/0219810 A1* 9/2010 Rocznik .......... G01R 33/07
                                                324/207.2
2013/0021026 A1   1/2013 Ausserlechner
2014/0210461 A1* 7/2014 Ausserlechner ..... G01R 33/075
                                                324/251

OTHER PUBLICATIONS

Reymond, S. et al., "True 2D CMOS integrated Hall sensor," 2007 IEEE Sensors Conference, Oct. 28-31, 2007, pp. 860-863.
Schott, CH., et al., "Linearizing Integrated Hall Devices," 1997 IEEE International Conference on Solid-State Sensors and Actuators, Jun. 16-19, 1997, pp. 393-396, IEEE, Chicago.
Wang, G., "Three-Dimensional Magnetic Field Sensor in IBM 0.18μm CMOS Technology," Master's Thesis Defense, Mar. 29, 2012, 1 pg.

* cited by examiner

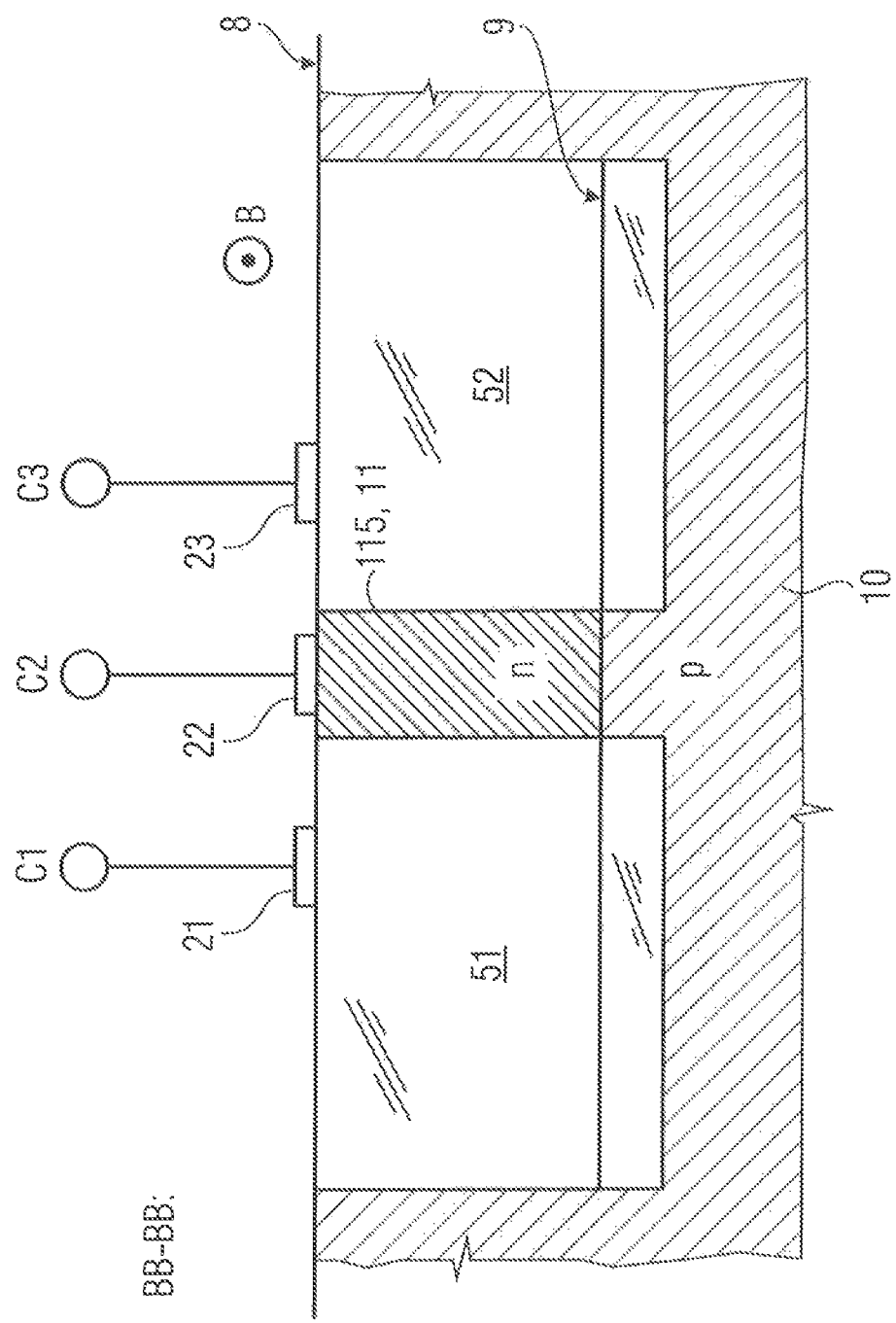

VERTICAL HALL DEVICE COMPRISING A SLOT IN THE HALL EFFECT REGION

This is a continuation application of U.S. application Ser. No. 13/531,076, entitled "Vertical Hall Device Comprising a Slot in the Hall Effect Region" which was filed on Jun. 22, 2012 and is incorporated herein by reference.

TECHNICAL FIELD

Embodiments of the present invention relate to a vertical Hall device and to a sensing method. Further embodiments of the present invention relate to a patterned tub for vertical Hall devices.

BACKGROUND

Vertical Hall sensors typically comprise a Hall effect region that is formed within a substrate, such as a semiconductor substrate. Vertical Hall sensors respond to magnetic field components parallel to the substrate or, more precisely, parallel to a main surface of the substrate.

Typically, vertical Hall sensors have one problem in common, namely an offset error. The offset is the output signal in the absence of the magnetic field (component) which the sensor should detect. The origin of the offset error is basically a slight asymmetry of the device. This asymmetry can be caused by asymmetry in the geometrical shape (which of course one tries to avoid). Yet, even in the case of perfect or near perfect geometrical asymmetry, the electrical potential distribution in the device causes an asymmetry, due to the junction field-effect. The junction field-effect is caused by the fact that a Hall sensor typically comprises a Hall effect region that is formed as a tub of opposite doping type than the surrounding substrate. Accordingly, the active region (i.e., the Hall effect region) of the Hall sensor is limited by a small pn-junction which causes the Hall sensor to exhibit a field effect transistor-like behavior. The junction field-effect causes nonlinearities and limits the maximal achievable value of magnetic sensitivity.

SUMMARY OF THE INVENTION

Embodiments of the present invention provide a vertical Hall device that comprises a Hall effect region, a separator, a first plurality of contacts and a second plurality of contacts. The Hall effect region comprises a first straight section, a second straight section that is offset parallelly to the first straight section, and a connecting section that connects the first straight section and the second straight section. The separator is configured to separate a portion of the first straight section from a portion of the second straight section. The first plurality of contacts is arranged in or at a surface of the first straight section. In an analog manner, the second plurality of contacts is arranged in or at a surface of the second straight section. With respect to a first clock phase of a spinning current scheme, the first plurality of contacts comprises a first supply contact and a first sense contact. Still with respect to the first clock phase of the spinning current scheme, the second plurality of contacts comprises a second supply contact and a second sense contact.

Further embodiments of the present invention provide a vertical Hall device that comprises a Hall effect region formed in a semiconductor substrate and an electrically insulating slot formed within a portion of the Hall effect region. The electrically insulating slot is formed from a surface of the semiconductor substrate. The vertical Hall device further comprises a first plurality of contacts arranged in or at the surface of a first section of the Hall effect region. The first plurality of contacts is distanced from corners of the Hall effect region. The vertical Hall device also comprises a second plurality of contacts that is arranged in or at the surface of a second section of the Hall effect region. The second plurality of contacts is distanced from corners of the Hall effect region and at an opposite side of the electrically insulating slot than the first plurality of contacts. With respect to a first clock phase of a spinning current scheme, the first plurality of contacts comprises a first supply contact and a first sense contact and the second plurality of contacts comprises a second supply contact and a second sense contact.

Further embodiments of the present invention provide a sensing method for sensing a magnetic field parallel to a surface of a substrate. The sensing method comprises applying an electrical supply to a Hall effect region formed within the substrate. The Hall effect region comprises a first straight section, a second straight section that is offset parallelly to the first straight section, and a connecting section that connects the first straight section and the second straight section. A first plurality of contacts is arranged in or at the surface of the first straight section. The first plurality of contacts is distanced from a first end and a second end of the first straight section. A second plurality of contacts is arranged in or at a surface of the second straight section. The second plurality of contacts is distanced from a first end and a second end of the second straight section. Applying the electrical supply occurs via a first supply contact among the first plurality of contacts and a second supply contact among the second plurality of contacts. The sensing method further comprises sensing a sense signal between a first sense contact among the first plurality of contacts and a second sense contact among the second plurality of contacts. The sensing method also comprises transitioning from a first clock phase of a spinning current scheme to a second clock phase by applying the electrical supply or another electrical supply to the first sense contact and the second sense contact. The sensing method further comprises sensing a further sense signal between the first supply contact and the second supply contact and determining an output signal indicative of the magnetic field on the basis of the sense signal and the further sense signal.

Further embodiments of the present invention provide a sensing method for sensing a magnetic field parallel to a surface of a substrate, the sensing method comprising applying an electrical supply to a Hall effect region formed within the substrate. An electrically insulating slot is formed within a portion of the Hall effect region from the surface of the semiconductor substrate. A first plurality and a second plurality of contacts is arranged in or at the surface of a first section and a second section of the Hall effect region. The first plurality and the second plurality of contacts are distanced from corners of the Hall effect region. Applying the electrical supply occurs via a first supply contact among the first plurality of contacts and a second supply contact among the second plurality of contacts. The sensing method further comprises sensing a sense signal between a first sense contact among the first plurality of contacts and a second sense contact among the second plurality of contacts. The sensing method also comprises transitioning from a first clock phase of a spinning current scheme to a second clock phase by applying the electrical supply or another electrical supply to the first sense contact and the second sense contact. The sensing method further comprises sensing a further sense signal between the first supply contact and the second supply contact and determining an output signal indicative of the magnetic field on the basis of the sense signal and the further sense signal.

BRIEF DESCRIPTION OF THE DRAWINGS

Embodiments of the present invention are described herein making reference to the appended drawings.

FIG. 1B shows a schematic cross-section of the vertical Hall device shown in FIG. 1A along line B-B;

Figure 1A:
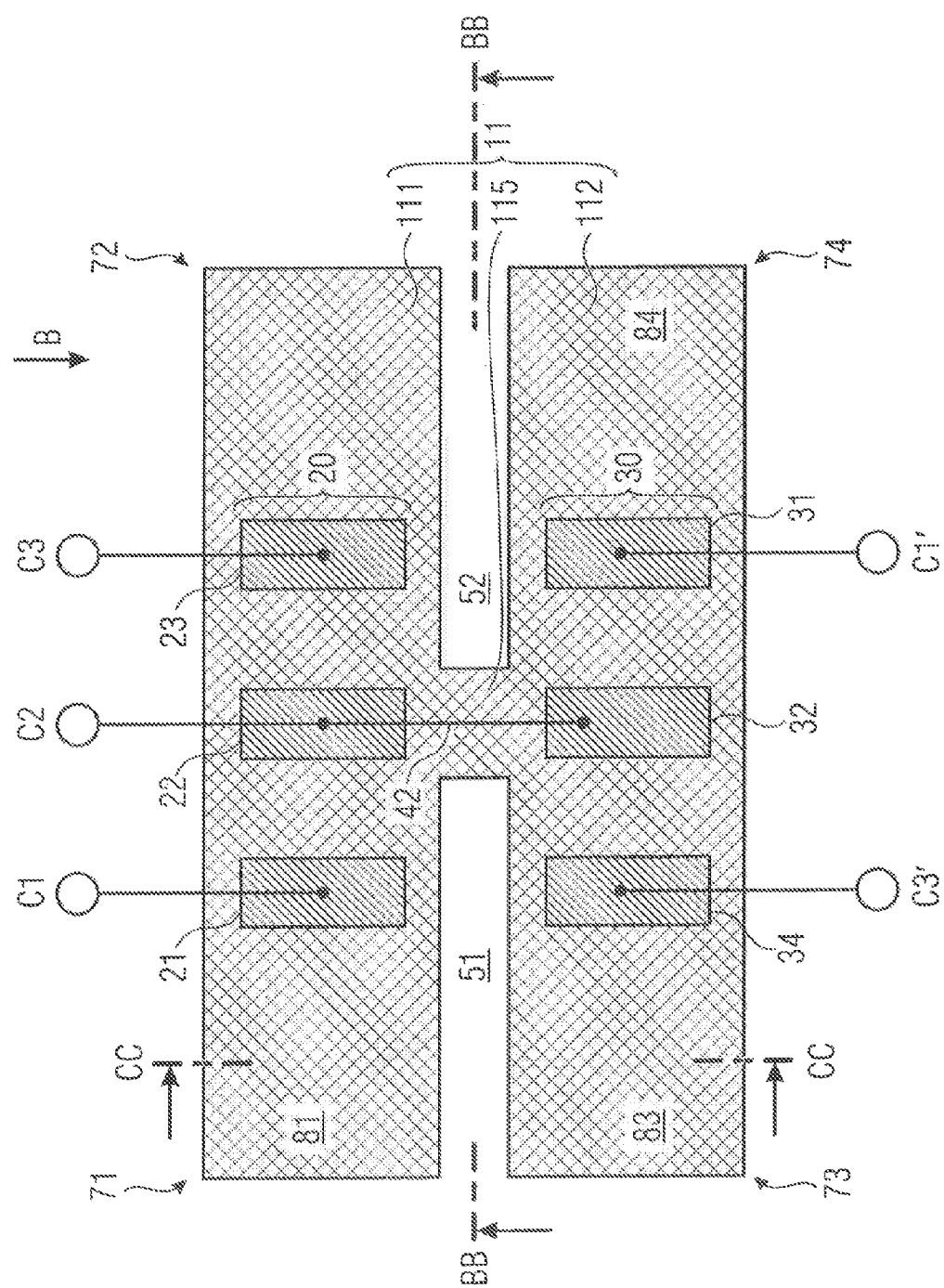
FIG. 1A shows a schematic plan view of a vertical Hall device according to a first embodiment.

Equal or equivalent elements or elements with equal or equivalent functionalities are denoted in the following description by equal or similar referenced signs.

DETAILED DESCRIPTION OF ILLUSTRATIVE EMBODIMENTS

In the following description, a plurality of details are set forth to provide a more thorough explanation of embodiments of the teachings disclosed herein. However, it will be apparent to one skilled in the art that embodiments disclosed herein may be practised without these specific details. Features of the different embodiments described hereinafter may be combined with each other, unless specifically noted otherwise.

A Hall effect region may be a tub or well of a first conductivity type which is embedded within a substrate or a tub/well of opposite conductivity type. This structure may cause an electrical isolation of the Hall effect region against the substrate in particular if the resulting pn-junction is reverse biased.

When the vertical Hall device comprises two or more Hall effect regions or when a Hall effect region comprises two or more sections, these may be (at least partially) isolated from each other. The electrical isolation of two Hall effect regions or sections against each other may take several forms. According to a first form of isolation, the two or more Hall effect regions/sections may be isolated in lateral direction by means of one or more trenches. Typically, the trenches are not empty, but filled with an electrically conducting, p-doped polycrystalline silicon which contacts the underlying p-substrate. For galvanic insulation of the Hall effect region(s) against the p-poly Si-plugs of the trenches the trench walls are lined with a thin oxide. As another option, the Hall effect region may be isolated towards the bottom by means of an SOI (silicon-on-insulator) structure. Although the Hall effect region typically has a single conductivity type, it may be advantageous to configure the doping concentration in an inhomogeneous manner, i.e., spatially variable. In this manner, a high concentration of the doping agent may occur in the area of the contact, as is usual with deep CMOS contacts. In the alternative, a layering of differently strongly doped layers may be sought after, as is the case with, e.g., a buried layer. Such a layering may result, to some extent, from technological reasons relative to other electronic structures that are formed within the substrate. The device of the vertical Hall device then may need to be reconciled with these circumstances, even though the layering may, in fact, be unfavourable for the vertical Hall device.

Another form of isolation may be achieved by measures that reduce or substantially prevent an electric current from flowing in one or more sub-regions of a Hall effect region. For example, the electric current may be offered an alternative current path that has lower ohmic resistance, (possibly by several orders of magnitude) than a substantially parallel current path would have that goes through the Hall effect region. The current path having the lower ohmic resistance may be a conductor formed in or on the surface of the tub.

Preferably, the Hall effect region may be an n-doped semiconductor as this provides a three times higher mobility and consequently a higher Hall factor than with a p-doped semiconductor. The doping concentration in the functional part of the Hall effect region is typically in the range of $10^{15}$ cm$^{-3}$ to $10^{17}$ cm$^{-3}$.

Embodiments of the vertical Hall device typically make use of the spinning current principle, in which supply- and sense-terminals are exchanged in consecutive clock phases/operating phases. A sense terminal in a vertical Hall device responds to an electric current passing underneath it. A magnetic field (parallel to the die surface and perpendicular to the current streamlines) can efficiently lift up or pull down the potential at the contact (which typically is at the surface of the die). The term "vertical Hall effect" or "vertical Hall device" may be thought of as being derived from the fact that the Hall effect in a vertical Hall device acts in a vertical direction (if the surface of the substrate is assumed to be horizontal). Contacts at the end of a tub (or semiconductor Hall effect region) typically are not, or only negligibly, subject to current streamlines passing underneath them.

FIG. 1A shows a schematic plan view of a vertical Hall device according to a first embodiment. The vertical Hall device comprises a Hall effect region 11 which is subdivided in a first straight section 111, a second straight section 112, and a connecting section 115. The approximate locations of (imaginary) boundaries between the first straight section 111 and the connecting section 115, as well as between the connecting section 115 and the second straight section 112 are indicated in FIG. 1A by dotted lines. The first and second straight sections 111, 112 are elongate and parallel to each other. The second straight section 112 is offset parallel from the first straight section 111 in a direction that is orthogonal to a longitudinal direction of the first and second straight sections 111, 112. The connecting section 115 connects the first straight section 111 and the second straight section 112 of the Hall effect region 11. In particular, the connecting section 115 connects a central portion of the first straight section 111 with a central portion of the second straight section 112.

The vertical Hall device further comprises two separators 51, 52 in the form of trenches that are formed in the substrate. As an alternative to the separators 51, 52 being in the form of trenches, the separation could be achieved by means of p-doped tubs. The first separator 51 separates a left portion of the first straight section 111 from a left portion of the second straight section 112. The second separator 52 separates a right portion of the first straight section 111 from a right portion of the second straight section 112. Note that designations "left" and "right" refer to the representation of the vertical Hall device in FIG. 1A, only, and shall not be construed as a possible restriction or limitation. In particular, the separator 51 shall prevent a direct current flow from a contact 21 to a contact 34. The separator 52 shall prevent a current flow from a contact 23 to a contact 31. Hence, the separation prevents that the significant current portions flow in direction parallel to the magnetic field (B-field)—the separation forces a direction on the current flow that is perpendicular to the B-field, since only then a strong Hall signal is generated.

The separators 51, 52 may also be understood as slots that are formed within a portion of the Hall effect region 11 from the surface of the semiconductor substrate. Departing from the embodiment illustrated in FIG. 1A, other embodiments may have a single separator, only, such as a single trench or a single slot. The trench(es) may be unfilled, lined, or (partly) filled with an electrically insulating material, such as silicon oxide. In case the trench or slot is lined with an electrically insulating material, the interior of the trench or slot may be filled with a doped material, such as a p-doped material, e.g., poly-Si and the surface of the rectangle may be coated by some thin insulating material (oxide).

The vertical Hall device schematically illustrated in FIG. 1A further comprises a first plurality of contacts 20 arranged in or at the surface of the first straight section 111. The first plurality of contacts 20 is distanced from a first end 81 and a second end 82 of the first straight section 111. Furthermore, the first plurality of contacts 20 is also distanced from corners 71, 72, 73, and 74 of the Hall effect region 11. In a similar manner, a second plurality of contacts 30 is arranged in or at a surface of the second straight section 112. The second plurality of contacts 30 is distanced from a first end 83 and a second end 84 of the second straight section 112 and also from the corners 71 to 74 of the Hall effect region 11. Optionally, the contact 21 and other outmost contacts could reach all the way to the end 71—a distance is not necessary in such alternative embodiments. For some embodiments the term "distanced from an end/corner" may be defined as a minimal distance between the plurality of contacts and the nearest end 81 to 84 of the corresponding straight section 111, 112 and/or the nearest corner 71-74 of the Hall effect region 11 is greater than an average spacing of the contacts within the plurality of contacts. Note that, until further notice, the corners should be interpreted in a broad manner and may be, for example, rounded corners or other structures that form a transition from one section of the Hall effect region 11 to another section.

The first plurality of contacts 20 comprises three contacts 21, 22, and 23. The second plurality of contacts 30 comprises three contacts 31, 32, and 34. The contacts are typically regions of high conductivity that are arranged in or at a surface of the Hall effect region 11. The contacts 21, 22, 23, 31, 32, and 34 are connected to different terminals C1, C2, C3, C1', and C3' as follows: contact 21 to terminal C1, contacts 22 and 32 to terminal C2, contact 23 to terminal C3, contact 31 to terminal C1', and contact 34 to terminal C3'.

During a first clock phase of a spinning current scheme, the contacts may be connected in the following manner. Contacts 21, 31, 22, and 32 function as supply contacts so that an electrical current is supplied to the Hall effect region 11 via the contacts 21 and 31. At the contacts 22 and 32 the electrical current is extracted from the Hall effect region 11. Note that the contacts 22 and 32 are electrically connected by a connection 42. In alternative embodiments, the contacts 21 and 31 could be electrically connected to each other, as well. The contacts 23 and 34 function as sense contacts. In the first straight section 111 of the Hall effect region 11 the electrical current flows along arc-shaped current stream lines from the contact 21 to the contact 22 that extend into the drawing plane of the graphical representation of FIG. 1A. Within the second straight section 112 of the Hall effect region 11 the electrical current follows arc-shaped current streamlines between contacts 31 and 32 and extending into the drawing plane in the representation of FIG. 1A, too. A magnetic field in the direction indicated by the arrow B in FIG. 1A influences the current distribution within the first and second straight sections 111, 112, which in turn leads to a measurable difference of the electrical potentials at the sense contacts 23 and 34.

The embodiment illustrated in FIG. 1A shows one option of how the Hall effect region 11 may be patterned as an "I"-Hall effect region. The two slots 51, 52 isolate C1 from C3' and C3 from C1'. Note that despite these isolations provided by the slots 51, 52, the first and second straight sections 111, 112 are still part of the same Hall effect region 11: The single Hall effect region 11 is patterned by the slots 51 and 52.

FIG. 1B shows a schematic cross-section of the vertical Hall device from FIG. 1A along the line BB-BB. The Hall effect region 11, of which only the connecting section 115 is visible in cross-section in FIG. 1B, is formed within a semiconductor substrate 10. The semiconductor substrate 10 has a main surface 8 from which the separators 51, 52 (slots or trenches or tubs of opposite polarity type (p-type or n-type)) extend into the substrate 10. The substrate 10 is, for example, a p-doped semiconductor substrate, whereas the Hall effect region 11 is n-doped. The Hall effect region 11 extends to a lower interface or boundary 9. The separators 51, 52 extend further into the substrate than the lower interface 9, so that the corresponding portions of the first straight section 111 and the second straight section 112 are separated by the separators 51, 52 and also the pn-junction between the n-doped Hall effect region 11 and the p-doped semiconductor substrate 10. In case the separators 51, 52 are implemented as p-doped insulation tubs, the p-doped insulation tubs do not reach beneath the pn-junction between the Hall effect region 11 and the substrate 10, but (exactly) to this depth.

Figure 1C:
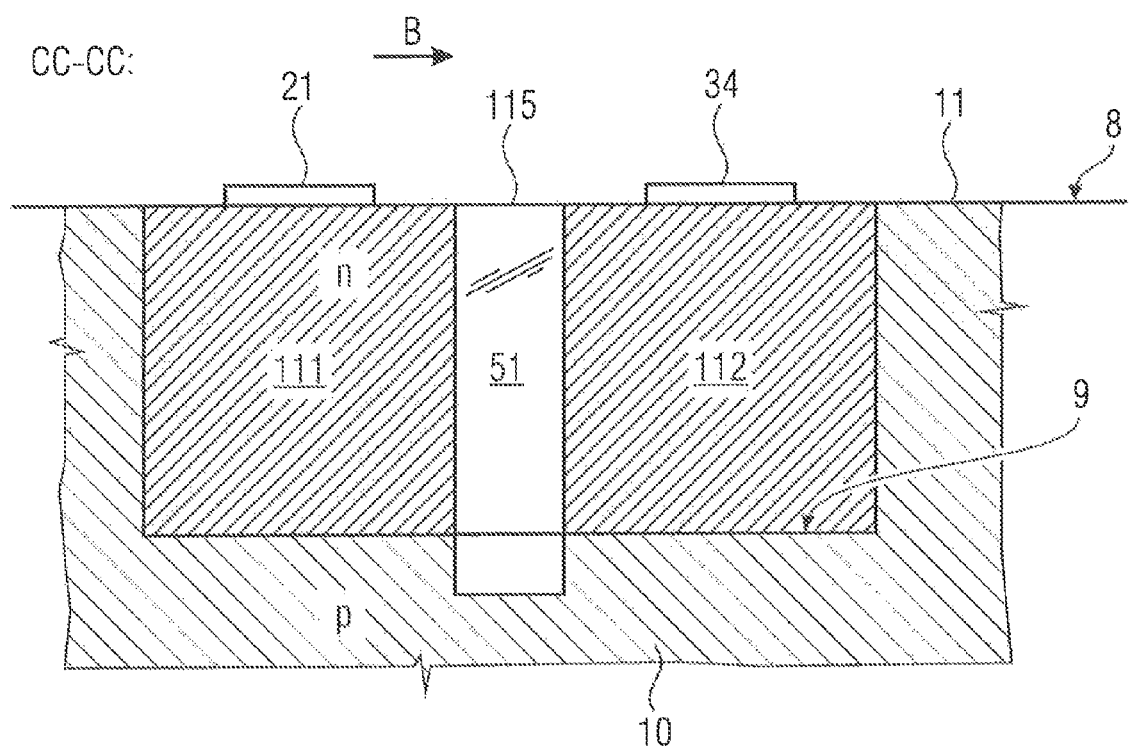
FIG. 1C shows a schematic cross-section of the vertical Hall device shown in FIG. 1A along line C-C.

FIG. 1C shows a schematic cross-section through the vertical Hall device of FIG. 1A along the line CC-CC. Here it can be seen that the separator 51 effectively insulates the corresponding portions of the first straight section 111 and the second straight section 112. Nevertheless, first and second straight sections 111, 112 are both part of the same Hall effect region 11, because they are connected to each other by the connecting section 115.

Figure 1D:
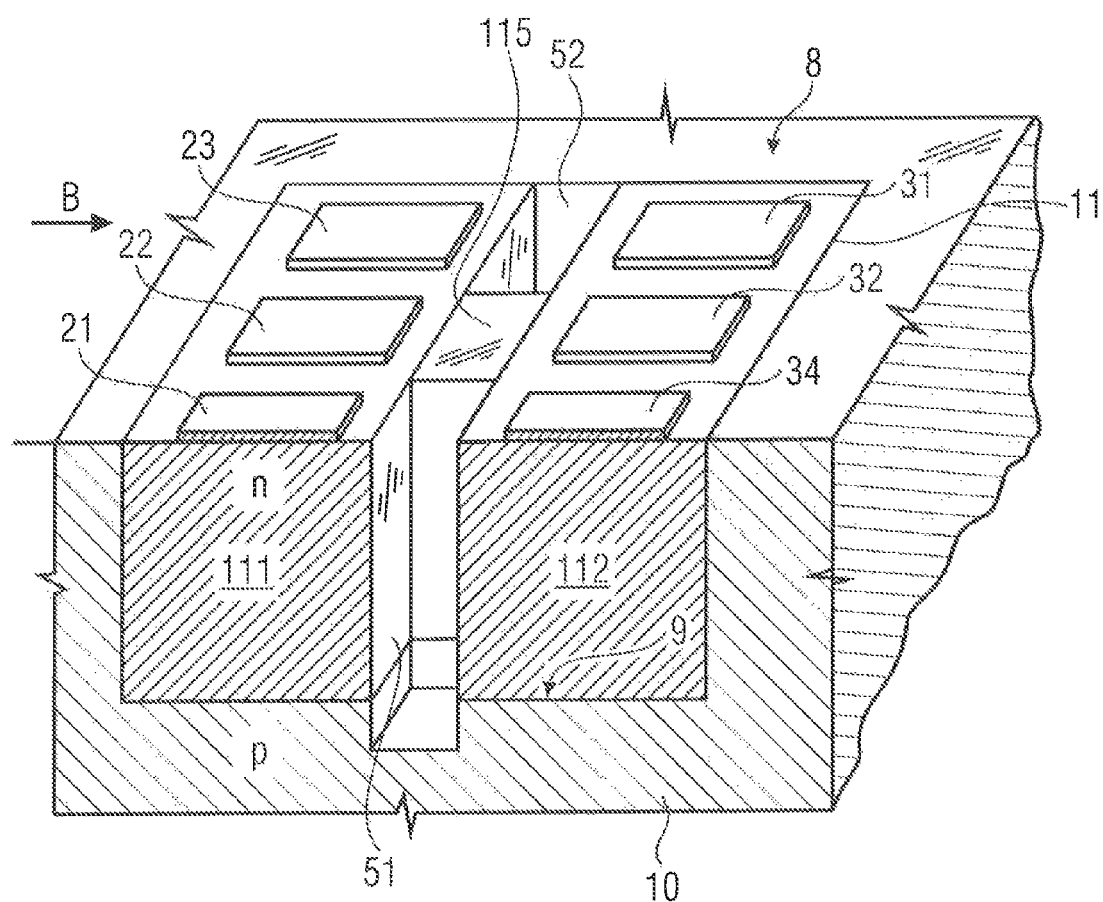
FIG. 1D shows a schematic perspective cross-section of the vertical Hall device shown in FIGS. 1A to 1C.

FIG. 1D shows a schematic perspective cross-section of the vertical Hall device shown in FIGS. 1A-1C. The cross-section plane is substantially parallel to the cross-section plane shown in FIG. 1C, however, slightly offset so that the cross-section goes through contacts 21 and 34. It can be seen that the separator or trench 51 extends through the Hall effect region 11 and also beyond the lower interface 9 into the semiconductor substrate 10. The separators 51, 52 are illustrated as empty slots in FIG. 1D for the sake of illustration. Typically however, the separators 51, 52 are filled.

Figure 1E:
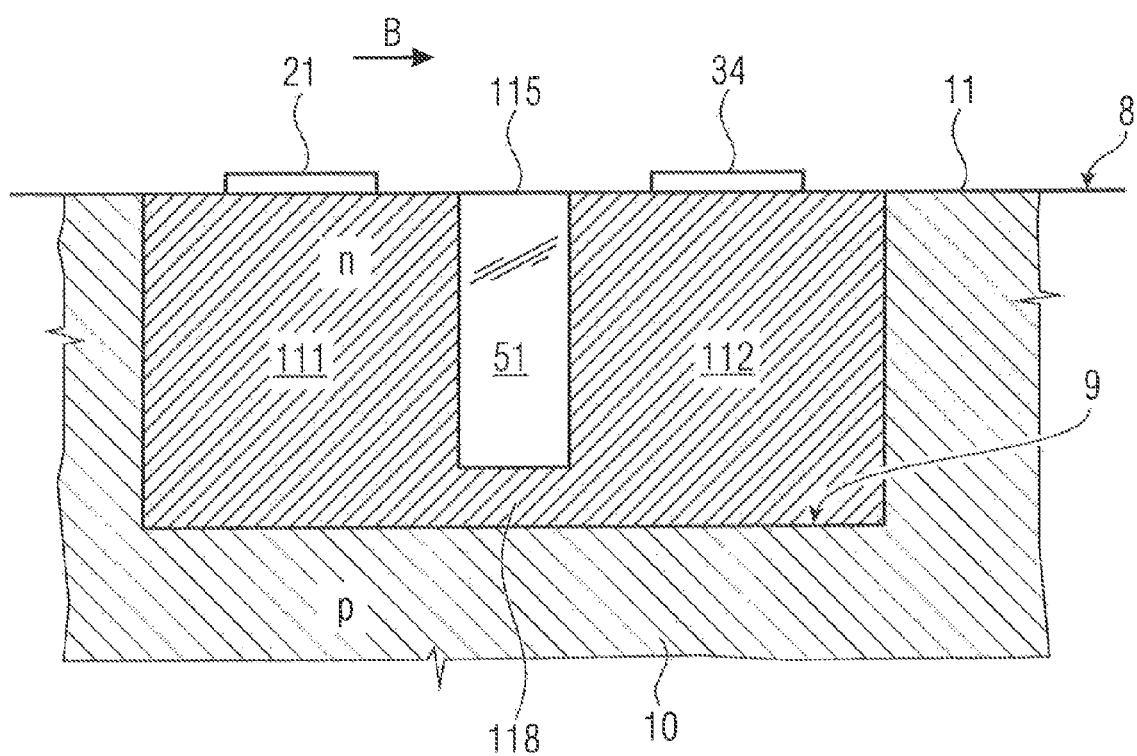
FIG. 1E shows a similar cross-section as FIG. 1C through a vertical Hall device according to a second embodiment that is similar to the first embodiment.

FIG. 1E shows a schematic cross section which is similar to the schematic cross-section of FIG. 1C, however, for a slightly different embodiment of the vertical Hall device. According to this embodiment, the separator 51 does not extend all the way down to the interface 9 which forms the lower boundary of the Hall effect region 11. A deep Hall effect region portion 118 beneath the separator 51 (and also the separator 52) connects the first straight section 111 and the second straight section 112. While in the embodiment according to FIGS. 1A-1C, the separators 51, 52 are deeper than the Hall effect region 11 to make a "perfect" slot, it is also possible to use a "slot" that is shallower than the Hall effect region 11, as in the embodiment according to FIG. 1E. This latter type of "slot" is not a "perfect" slot, because electrical current can pass underneath it from the first straight section 111 to the second straight section 112. However, it still has some insulating function between the first straight section 111 and the second straight section 112 (particularly if the "slot" 51 is not narrow, but wide). In some technologies there might be no deep p-tub available to make a perfect slot and then one may resort to a shallow "slot" approximation.

The Hall effect region 11 may extend to a first depth into the semiconductor substrate 10. The separator(s) 51, 52 may extend to a second depth into the semiconductor substrate that is smaller than the first depth. In this case, the first straight section 111 and the second straight section 112 are also connected, in addition to the connecting section(s) 115, 116, via a deep Hall effect region portion that is located beneath the separator(s) 51, 52 (i.e., further into the substrate relative to the main surface 8).

Figure 1F:
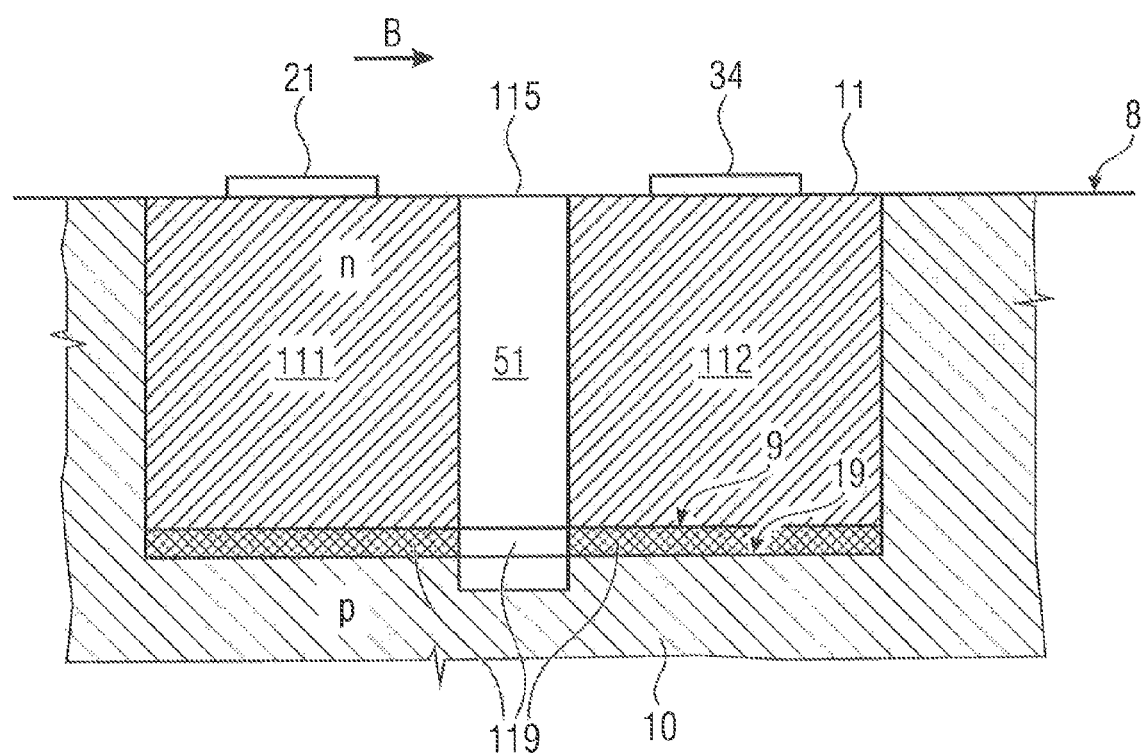
FIG. 1F shows a similar cross-section as FIG. 1C through a vertical Hall device according to a further embodiment that is similar to the first embodiment.

FIG. 1F shows a schematic cross section through a vertical Hall device according to a further embodiment. The cross section in FIG. 1F is similar to the cross section of FIG. 1C. The difference is that the vertical Hall device illustrated in FIG. 1F comprises a buried layer 119 beneath the Hall effect region 11. The buried layer 119 may be a so called n-buried layer. According to the embodiment of FIG. 1F, the buried layer 119 is structured in substantially the same manner as the Hall effect region 11. The separators 51, 52 pass through the Hall effect region 11 and also through the buried layer 119. The buried layer 119 also comprises a section beneath the connecting section 115 of the Hall effect region 11. An interface 19 separates the buried layer 119 from the substrate 10.

Figure 1G:
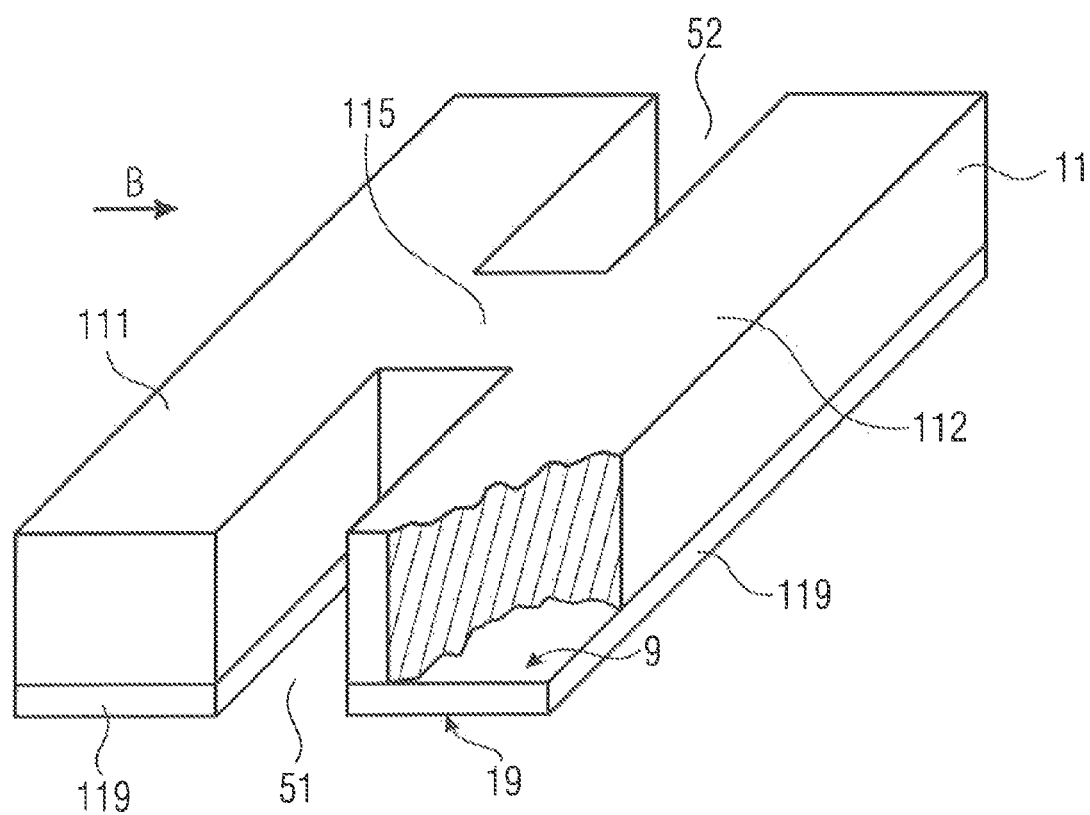
FIG. 1G shows a schematic, perspective view of the Hall effect region and the buried n-doped layer (nBL) of the embodiment shown in FIG. 1F.

FIG. 1G shows a schematic, perspective view of the Hall effect region 11 and the buried layer 119 of the Hall effect device according to FIG. 1F. It can be seen that the buried layer 119 is structured or shaped in the same manner as the Hall effect region 11. According to the embodiment schematically shown in FIGS. 1F and 1G, it is optionally possible that a buried layer 119 that is completely congruent to the Hall effect region 11 is present beneath the Hall effect region 11. The buried layer may have the following effect. Due to the identical structure of the buried layer 119 and of the Hall effect region, the buried layer 119 enforces a homogeneous potential at the lower surface of the Hall effect region 11. In comparison, two distinct Hall effect regions that are connected only at the upper surface by means of wires or the like, the two distinct buried layers located beneath the two distinct Hall effect regions would be at different potentials. As a result, the embodiment according to FIGS. 1F and 1G has a significantly different behavior (e.g., with respect to the offset error) than an electrical connection of two distinct Hall devices by means of their surface contacts, only.

Note that in the embodiment shown in FIGS. 1A to 1D and also in the slightly modified embodiments shown in FIG. 1E to 1G, the separators 51 and 52 are depicted as empty, unfilled trenches, as this facilitates a more comprehensible graphical representation of the vertical Hall device according to embodiments. However, as an alternative, the separators 51, 52 could be trenches that are lined with an electrically insulating material, such as an oxide. As another alternative, the separators 51, 52 could be trenches that are filled with an electrically insulating material, e.g., oxide or the oppositely doped material of the Hall effect region 11 (that is, p-doped semiconductor within the trenches forming the separators 51, 52, in case the Hall effect region 11 is an n-doped semiconductor). Yet another alternative for the separators 51, 52 would be to line the trenches with an electrically insulating material and to fill the resulting cavity within the trenches with, for example polycrystalline silicon (poly-Si) or another suitable material that can be deposited to fill the resulting cavity. Yet another option for the separators 51, 52 would be p-doped tubs formed within the Hall effect region 11.

In FIGS. 1A-1G the Hall effect region 11 has the shape of the letter "I" (or the letter "H" when looking from the side). In embodiments that will be described next, the Hall effect region 11 is patterned in the form of the letter "O". The "I"-Hall effect region can be thought of being obtained by inverting the "O" Hall effect region, or vice versa.

Figure 2A:
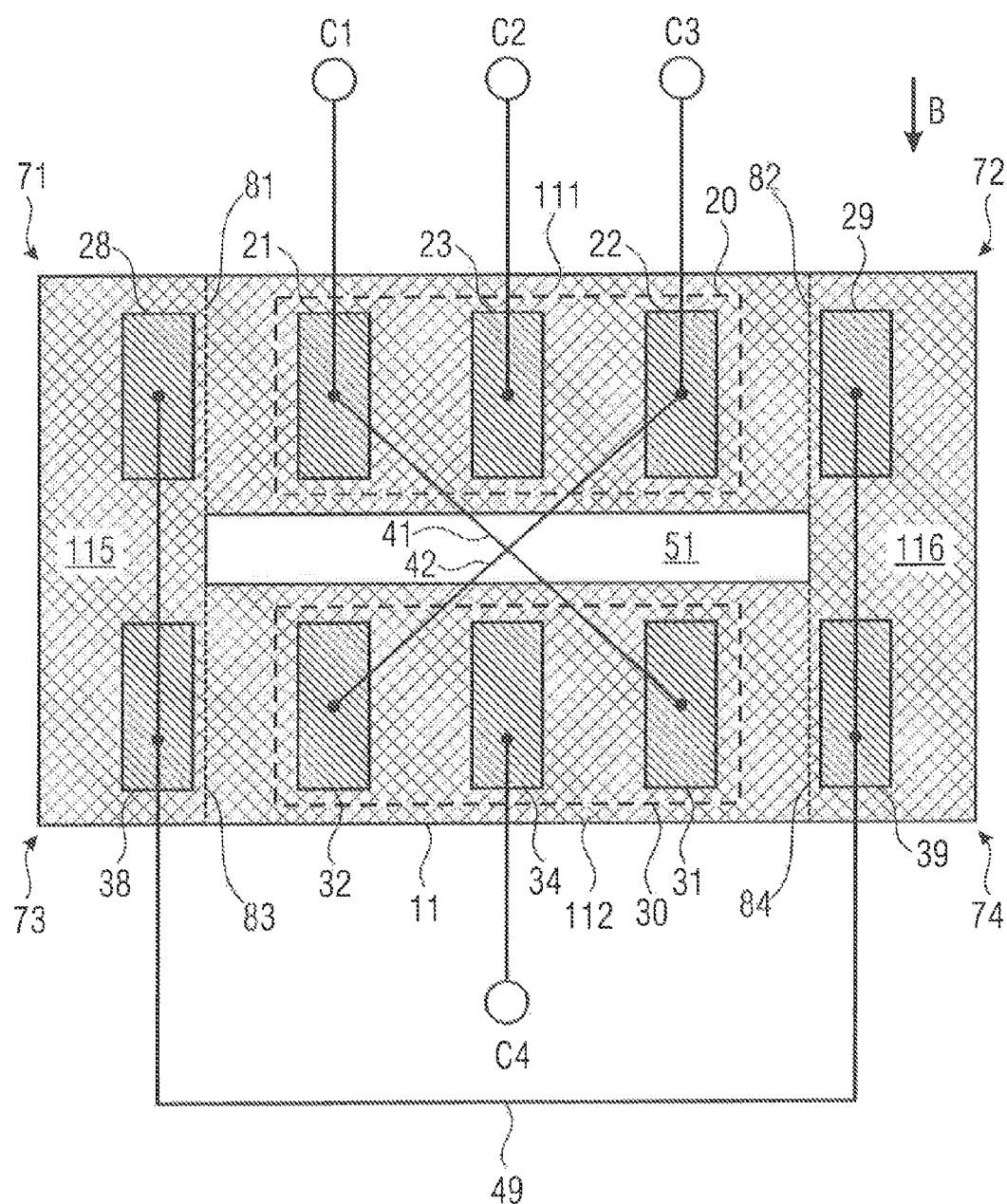
FIG. 2A shows a schematic plan view of a vertical Hall device according to a third embodiment.

FIG. 2A shows a schematic plan view of a vertical Hall device according to another embodiment in which the Hall effect region 11 is patterned in the form of an "O". The Hall effect region 11 comprises a first straight section 111, a second straight section 112, a connecting section 115, and a further connecting section 116. The separator 51 is located in the middle of the Hall effect region 11 and may be an unfilled trench, a filled trench, a lined trench, or a lined-and-filled trench. Accordingly, the vertical Hall device has the Hall effect region 11 that consists of a single tub, where the slot 51 is cut out. The slot 51 cuts out an inner part of the Hall effect region 11, so that the topology of the Hall effect region 11 is a ring structure when viewed from above. When considering the actual three-dimensional shape of the Hall effect region 11, the same is a kind of (rectangular) torus. In contrast to other vertical Hall devices of the Hall effect region 11 is not a straight parallelepiped anymore, but a connected domain in 3D.

The slot or separator 51 divides the entire Hall effect region 11 into four parts: an upper branch or section 111 (from contact 21/terminal C1 over contact 23/terminal C2 to contact 22/terminal C3), a lower branch 112 (from contact 32/terminal C3 over contact 34/terminal C4 to contact 31/terminal C1), a left short or connecting section 115 (shorting the leftmost upper and lower contacts 28, 38), and a right short or connecting section 116 (shorting the rightmost upper and lower contacts 29, 39).

Five contacts 28, 21, 23, 22, and 29 are lined up on a line parallel to the slot and above (with respect to the representation of FIG. 2A) the slot 51. Another five contacts 38, 32, 34, 31, and 39 are lined up on a line parallel to the slot 51 and below the slot 51. All leftmost contacts 28, 38 and rightmost contacts 29, 39 are connected to a single network node 49. The three inner contacts 21, 23, 22, 32, 34, and 31 of the upper and lower branches 111, 112 constitute, or are connected to, the terminals C1 to C4 of the device, whereby the left contact 21 of the upper branch or straight section 111 is shorted to the right contact 31 of the lower branch or straight section 112 in a diagonal fashion by means of a connection 41. In a similar manner the right contact 22 of the upper branch (straight section) 111 is shorted to the left contact 32 of the lower branch (straight section) 112 (also in a diagonal fashion by means of a connection 42). This gives four terminals C1, C2, C3, and C4. In a first clock-phase of a spinning current scheme the odd terminals C1 and C3 act as supply terminals and the even contacts C2, C4 as sense terminals. In a second clock phase of the spinning current scheme the even contacts C2, C4 act as supply terminals and the odd contacts C1, C3 as sense terminals.

The imaginary boundaries 81 to 84 between the four different sections 111, 112, 115, 116 of the Hall effect region 11 are indicated by dotted lines in FIG. 2A. These boundaries 81 to 84 also define first and second ends of the first straight section 111 and the second straight section 112. In FIG. 2A the boundaries 81 to 84 are illustrated as being the extensions of the edges of the separator 51, but this is not necessarily so. Indeed, the straight sections 111 and 112 may extend beyond the edges of the separator 51. For example, the straight sections 111, 112 may extend all the way to the left edge and the right edge of the Hall effect region 11 so that also the contacts 28, 29, 38, and 39 are arranged at the surface of the straight sections 111, 112. It can be seen that the first plurality of contacts 20 is distant from the first end 81 and the second end 82 of the first straight section 111. In the embodiment schematically illustrated in FIG. 2A the distance between the first end 81 and the left contact 21 is greater than half of the spacing between the contacts of the first plurality of contacts 20. In alternative embodiments the distance between the first end 81 and the nearest contact of the first plurality of contacts 20 (here contact 21) may be arbitrarily chosen, for example greater than 10%, 20%, 25%, 30%, or 40% of the spacing of contacts within the first plurality of contacts 20. The same applies to the other ends 82, 83, and 84 and the corresponding closest contacts of the first and second pluralities of contacts 20, 30.

The separator 51 has the task of conducting the current flow during the first clock phase from contact 21 to contact 22, thus having the current passing underneath contact 23, while preventing that significant portions of the current branch off towards contact 32 (which always occurs to a certain degree). During the second clock phase the separator 51 has a similar task. The separator(s) is/are perpendicular to the direction of the magnetic field component that is to be measured and are configured to guide a major portion of the current perpendicularly to the magnetic field so that a strong Hall signal can be generated.

The first plurality of contacts 20 is also a certain minimal distance away from the corners 71 to 74 of the Hall effect region 11. The contacts 21, 23, and 22 are lined up on a line that is parallel and/or coincides with a longitudinal axis of the first straight section 111. Similar observations can be made for the second plurality of contacts 30, which is distanced from the first end 83 and the second end 84 of the second straight section 112. Furthermore, the second plurality of contacts 30 is also distanced from the corners 71-74 of the Hall effect region 11.

The slot or separator 51 can be made as a trench as is common in BiCMOS technologies: with these technologies, the interior of the slot 51 would typically be chosen to be a p-doped material (e.g., poly-Si) and the surface (interface to the Hall effect region 11) may typically be chosen to be coated by some thin insulating material (e.g., oxide). Alternatively, the slot 51 can be made as a tub or well of inverse doping with respect to the Hall effect region 11: typically, the Hall effect region is n-doped, so that the slot 51 may be p-doped. Then, the slot 51 is contacted and a voltage is applied which is lower or equal to the lowest potential in the Hall effect region 11 in order to make a junction isolation between p-doped and n-doped regions. The p-doped region 51 may be deeper or just as deep as the Hall effect region 11 to make a perfect slot. However, it is also possible to use a "slot" that is shallower than the Hall effect region 11. This latter type of "slot" is not a perfect slot because current can pass underneath it from C2 to C4. However, it still has some isolating function between the upper and lower branches 111, 112 (particularly if the "slot 51 is not narrow, but wide"). In some technologies there might be no deep p-tub available to make a perfect slot and then one may resort to a shallow "slot" approximation. In case a buried layer is present, the separator(s) should typically be sufficiently deep so as to reach the buried layer. In this manner the separator (s) may separate a first portion of the buried layer that is beneath the first straight section 111 from a second portion of the buried layer that is beneath the second straight section 112. Otherwise a significant amount of electrical current could flow through the buried layer underneath the separator (s), thus diminishing the effect of the separator(s).

Figure 2B:
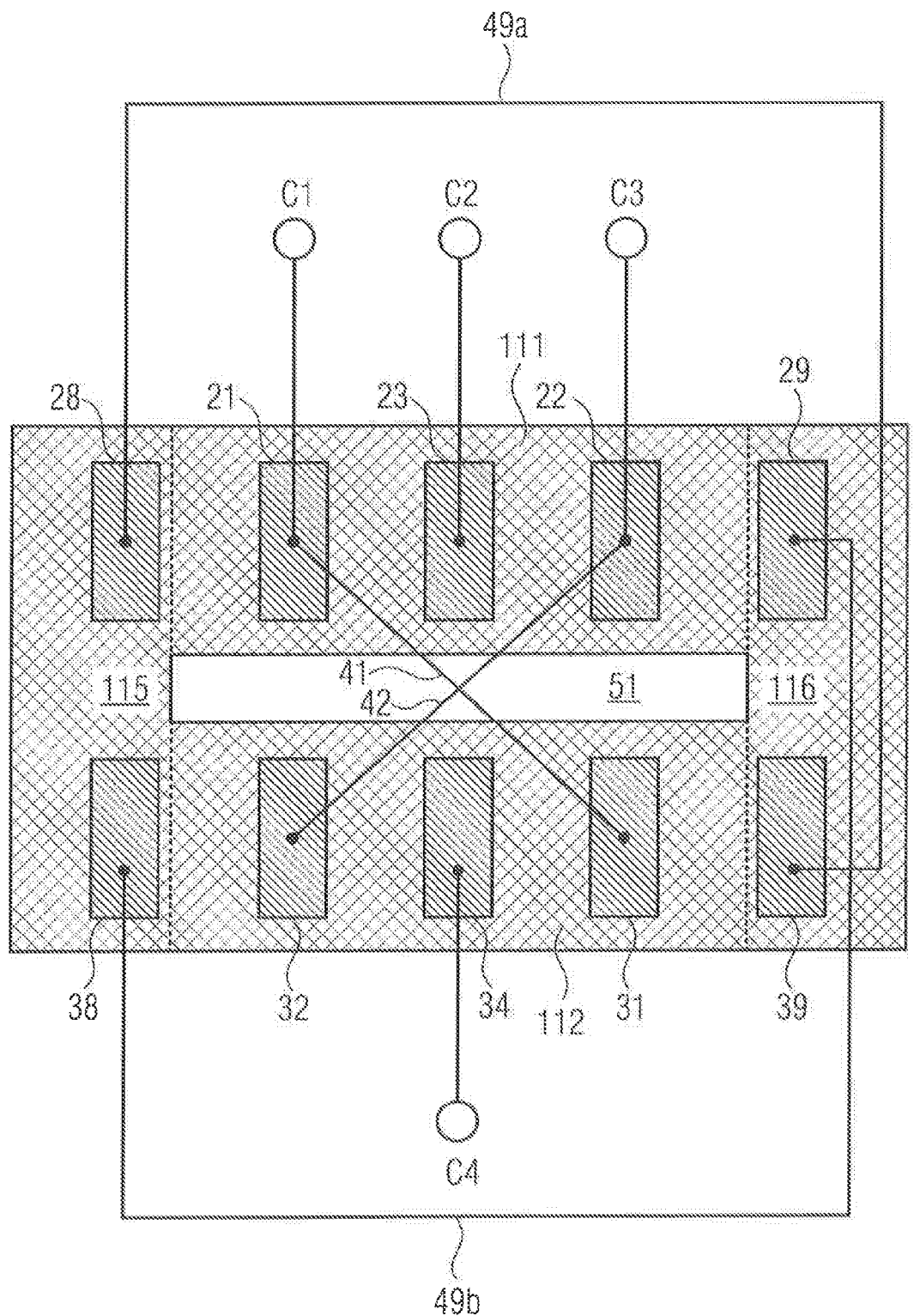
FIG. 2B shows a schematic plan view of a vertical Hall device according to a variation of the third embodiment.

FIG. 2B shows a schematic plan view of a vertical Hall device according to a variation of the embodiment shown in FIG. 2A. In the embodiment according to FIG. 2A, it would be desirable if approximately half of the current would flow from contact 21 to contact 22 and would generate a Hall signal at contact 23. It would further be desirable that approximately the other half of the current would flow from contact 31 to contact 32 and would generate a Hall signal at contact 34. In reality, a portion of the current flows from contact 21 to contact 32 via contact 28, which is connected to contact 38 without generating a Hall signal at any of the sense contacts 23, 34. The same also happens between contacts 31 and 22, where a portion of the current flows via the connected contacts 39 and 29, without producing a Hall signal.

In order to reduce these current losses, the contacts 28 and 39 are connected to a network node 49a, while the contacts 29 and 38 are connected to another network node 49b. Hence, the single network node 49 from FIG. 2A is replaced by two individual network nodes 49a, 49b. By varying the width of the separator 51 the remaining current losses can be influenced: the wider the separator 51 (and the more narrow the connecting sections 115, 116), the lower the current losses. This modification may be applied to all configurations having diagonal connections between the upper and lower plurality of contacts, in particular to the embodiments shown in FIGS. 3, 7 and 8 which will be described below.

Figure 3:
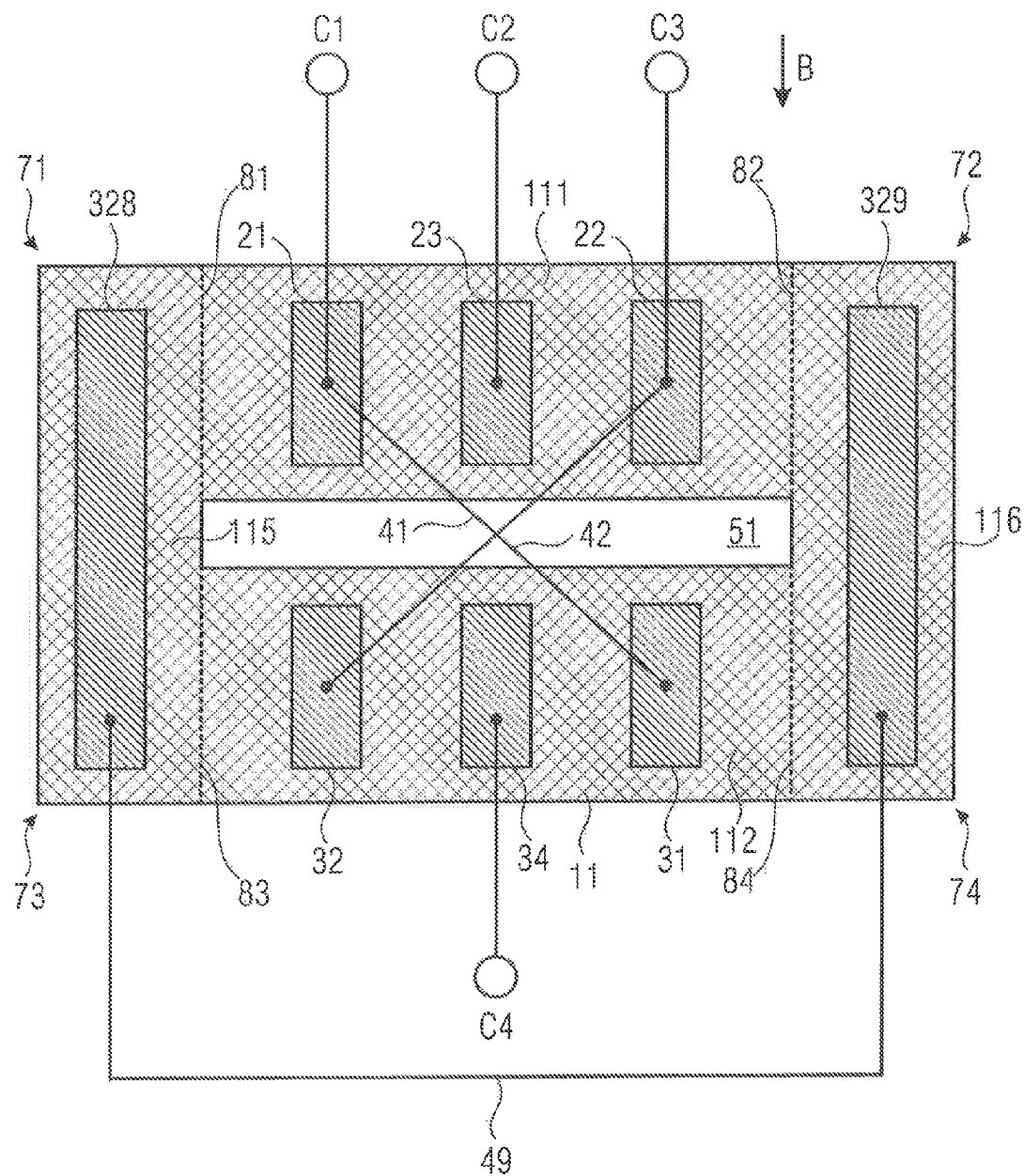
FIG. 3 shows a schematic plan view of a vertical Hall device according to a fourth embodiment.

FIG. 3 shows a schematic plan view of a vertical Hall device according to a further embodiment in which the outer contacts are modified compared to the embodiment shown in FIG. 2A. The vertical Hall device shown in FIG. 3 comprises outer contacts 328 and 329 that are as long as to reach from the upper branch 111 right through to the lower branch 112. Again, the outer contacts or short circuit contacts 328, 329 are connected to the single network node 49.

In the vertical Hall devices according to the embodiments shown in FIG. 1A to FIG. 3 and also in most of the other embodiments, the first plurality of contacts 20 and the second plurality of contacts 30 are pairwise aligned to each other along a direction defined by a parallel offset of the first straight section 111 and the second straight section 112. The parallel offset between the first and second straight sections 111, 112 is typically orthogonal to the longitudinal axis of the straight sections 111, 112. The property of pairwise alignment between the first and second plurality of contacts 20, 30 means that one contact of the first plurality of contacts 20 may be translated in the direction and by the distance defined by the parallel offset between the first and second straight sections 111, 112 and then substantially coincides with its aligned contact of the second plurality of contacts 30. In other words, the positions of the contact within the first plurality of contacts 20 and the contact within the second plurality of contacts 30 are mirror symmetric with respect to a mirror plane that passes through the separator 51 or the separators 51, 52. Typically, this mirror plane is parallel to the longitudinal axis of the first and second straight sections 111, 112 and orthogonal to the surface 8 of the semiconductor substrate 10.

According to some embodiments, at least one supply contact 21, 22 of the first plurality of contacts 20 is aligned with a supply contact 32, 31 of the second plurality of contacts 30. At least one sense contact 23 of the first plurality of contacts 20 is aligned with a sense contact 34 of the second plurality of contacts 30. The embodiments shown in FIGS. 2 and 3 are examples for this sort of alignment. In particular, not only the positions of the individual contacts within the first and second plurality of contacts 20, 30 are pairwise aligned of each other, but also with respect to whether the aligned contacts act as supply contacts or as sense contacts during the different clock phases of the spinning current scheme. Note, however, that two aligned supply contacts might be connected to different electrical supply potentials, as is the case in, e.g., the embodiments according to FIGS. 2 and 3. For example, the supply contact 21 of the first plurality of contacts 20 may be connected to a higher electrical potential than its pairwise aligned counterpart, contact 32, which may be connected to a lower electrical supply potential during the first clock phase of the spinning current scheme. A similar observation can be made for two aligned sense contacts, e.g., contacts 23 and 34 of the embodiments according to FIGS. 2 and 3 during the first clock phase of the spinning current scheme.

According to other embodiments, such as illustrated in FIGS. 1A to 1E, at least one supply contact 21 of the first plurality of contacts 20 may be aligned with a sense contact 34 of the second plurality of contacts 30, and at least one sense contact 23 of the first plurality of contacts 20 may be aligned with a supply contact 31 of the second plurality of contacts 30.

As shown in FIGS. 2 and 3, the vertical Hall device may comprise a further connecting section 116 that connects the first straight section 111 and the second straight section 112 at a different position than the connecting section 115. In this manner the first straight section 111, the second straight section 112, the connecting section 115, and the further connecting section 116 form a frame for the separator 51 (e.g., slot or trench). The Hall effect region 11 forms a frame for the separator 51 in that, at least in a lateral direction (i.e., parallel to the substrate surface 8) the separator 51 is surrounded by the Hall effect region 11. In other words, the Hall effect region 11 "frames" the separator or slot 51.

The vertical Hall device may further comprise a plurality of short circuit contacts 28, 29, 38, 39, 328, 329 arranged in or at the surfaces of the connecting section 115 and the further connecting section 116. The short circuit contacts may be electrically connected to a single network node 49.

The first plurality of contacts 20 may comprise at least three contacts 21, 22, 23. The second plurality of contacts 30 may comprise at least three contacts 31, 32, 34. Referring to the embodiments of FIGS. 2 and 3 and in a representative and by no means limiting manner, for the sake of explanation, at least one contact 21, 22 of the first plurality of contacts 20 may be electrically connected to at least one of in the case of contact 21: a next but one contact 21 of an aligned contact 32 of the second plurality of contacts 30, and in the case of contact 22: a preceding but one contact 32 of an aligned contact 31 of the second plurality of contacts 30.

The aligned contact 32, 31 is aligned to the at least one contact 21, 22 of the first plurality of contacts 30. As will be described with respect to embodiments according to FIGS. 7 and 8, this pattern may be extended.

Instead of regarding the short circuit contacts as being separate from the first plurality of contacts 20 and/or the second plurality of contacts 30, the first plurality of contacts 20 may comprise a first short circuit contact as an outmost contact. The second plurality of contacts 30 may comprise a second short circuit contact as an outmost contact. The first and second short circuit contacts may be electrically connected to a single network node 49.

The vertical Hall device according to embodiments may further comprise four terminals, two of which may be configured to function as supply terminals and the other two being configured to function as sense terminals during the first clock phase of the spinning current scheme. Each of the four terminals C1 to C4 may be connected to exactly one outer contact of the first plurality of contacts 20 or the second plurality of contacts 30 and to at least one inner contact of the second plurality of contacts 30 and the first plurality of contacts 20.

Figure 4:
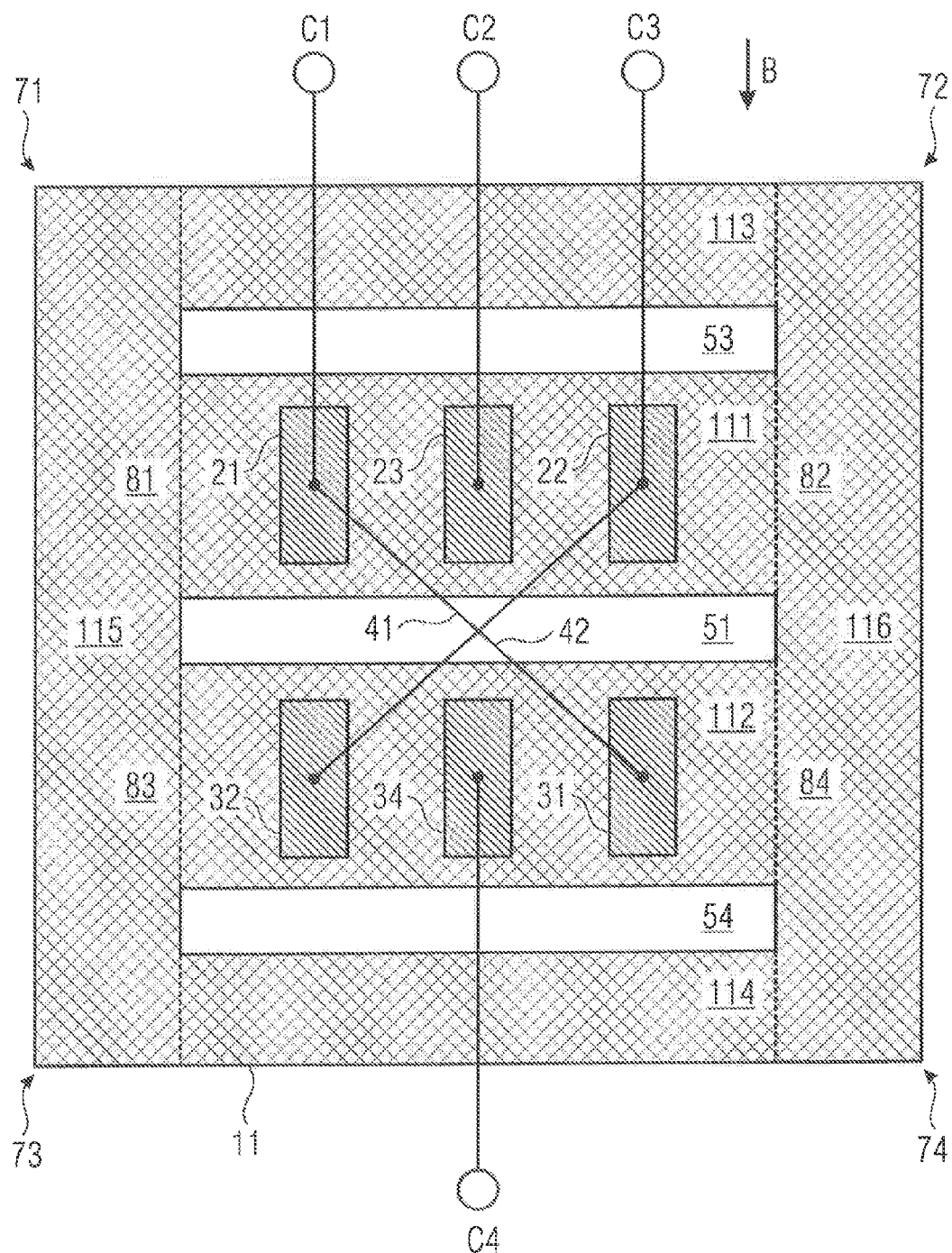
FIG. 4 shows a schematic plan view of a vertical Hall device according to a fifth embodiment.

FIG. 4 shows a schematic plan view of a vertical Hall device according to embodiments. As can be seen in FIG. 4, it is also possible to do without the outmost contacts or short circuit contacts (reference numerals 28, 29, 38, 39, 328, and 329 in FIGS. 2 and 3) by using additional slots or separators 53, 54 that shape or pattern the Hall effect region 11 by a multiple connected topology. The Hall effect region 11 further comprises a third straight section 113 and a fourth straight section 114 in addition to the first and second straight sections 111, 112, the connecting section 115, and the further connecting section 116. The third straight section 113 and the third straight section 114 are offset parallel to the first and second straight sections 111, 112. The connecting section 115 also connects the third straight section 113 and the fourth straight section 114 with the first and second straight sections 111, 112. The further connecting section 116 also connects the first, second, third, and fourth straight sections 111-114 with each other, however, at another location than the connecting section 115. As a result, the Hall effect region 11 has a ladder-like structure (multiple connected topology). According to the embodiment shown in FIG. 4, no contacts are arranged in or at the surface of the third straight section 113 and the fourth straight section 114.

A separator 53 in the form of a slot or a trench separates at least a portion of the first straight section 111 from a portion of the third straight section 113. Another separator 54 in the form of a slot or a trench separates at least a portion of the second straight section 112 from at least a portion of the fourth straight section 114. The vertical Hall device thus comprises the second slot 53 and the third slot 54 in addition to the first slot 51. The second and third slots 53, 54 are formed within further portions of the Hall effect region 11, so that the Hall effect region 11 has a ladder-like structure.

In FIG. 4 it is of course also possible to use only two slots (e.g., to omit the lower slot 54)—but the presence of both slots 53, 54 increase the symmetry of the device and this is believed to result in a better (smaller) residual offset or zero-point error.

Note that in FIG. 4 the Hall effect region 11 itself makes a short between the upper branch (first straight section) 111 and the lower branch (second straight section) 112. If the Hall effect region 11 has too high impedances, one can shape its lateral dimensions (e.g., width) to approximate a good short. There are CMOS technologies where the epitaxial layer (nEpi) may be used as the Hall effect region 11.

Furthermore, there are CMOS technologies which use a highly conductive buried layer (nBL, wherein the "n" stands for n-doped) underneath the epitaxial layer. This nBL acts as a good short supporting the less conductive Hall effect region 11 (both are electrically connected in parallel): in FIG. 4, the nBL would have, for example, the same shape as the Hall effect region 11, simply the nBL is below the Hall effect region 11 and both are in good contact (there is no isolation between them). One advantage of the nBL is that it pulls the charge carriers away from the top surface of the Hall effect region 11, which typically has lots of traps and defects, thereby reducing flicker noise and lifetime-drift of the vertical Hall device.

Figure 5:
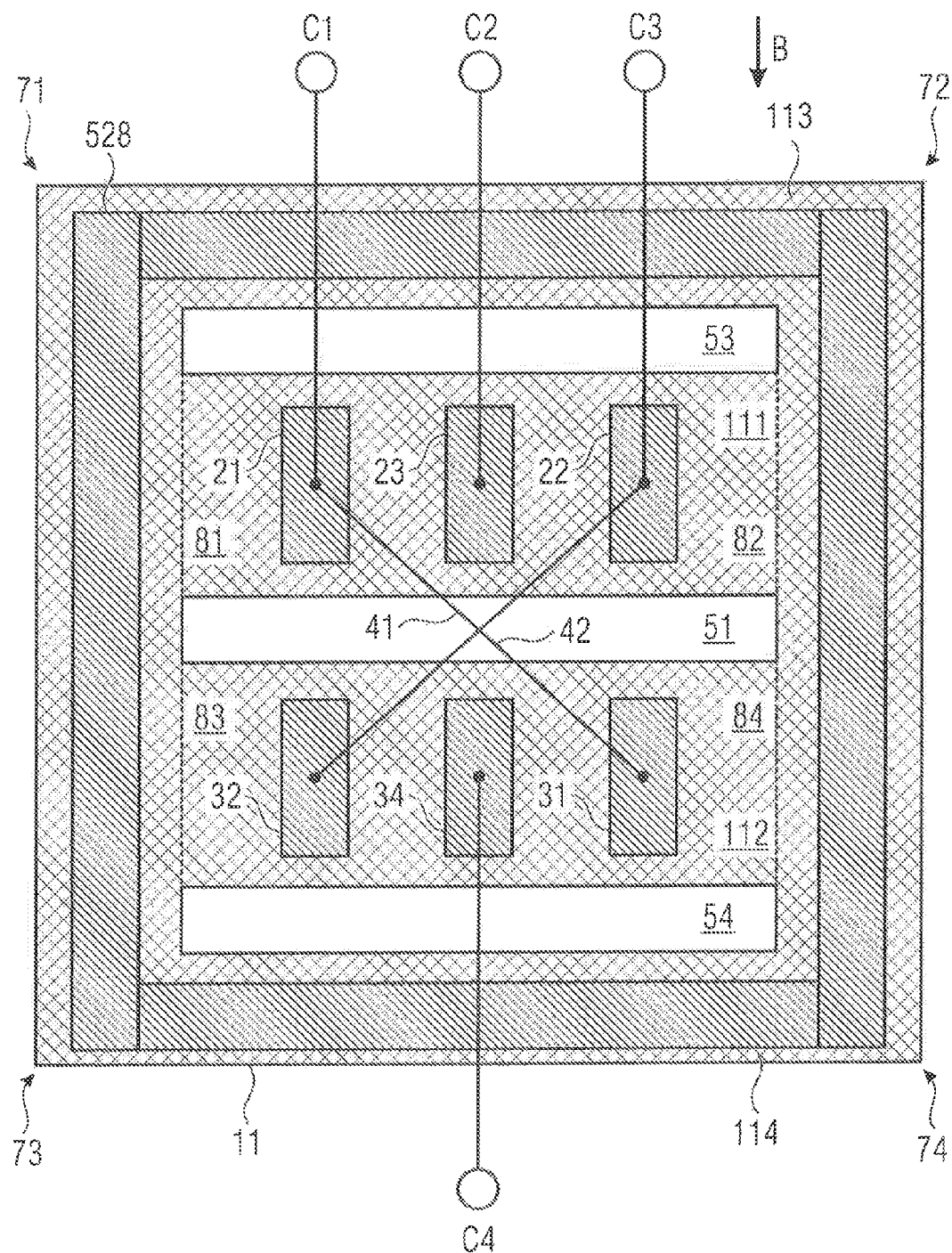
FIG. 5 shows a schematic plan view of a vertical Hall device according to a sixth embodiment.

FIG. 5 shows a schematic plan view of a vertical Hall device according to an embodiment similar to the vertical Hall device shown in FIG. 4. In particular, it is possible to improve the short circuit of the first and second straight sections 111, 112 in the embodiments of FIG. 4 by additional contacts 528 in the shape of a ring or frame (which may also degenerate to a "U" if, for example, the upper slot 53 and hence the third straight section 113 are omitted).

Figure 6:
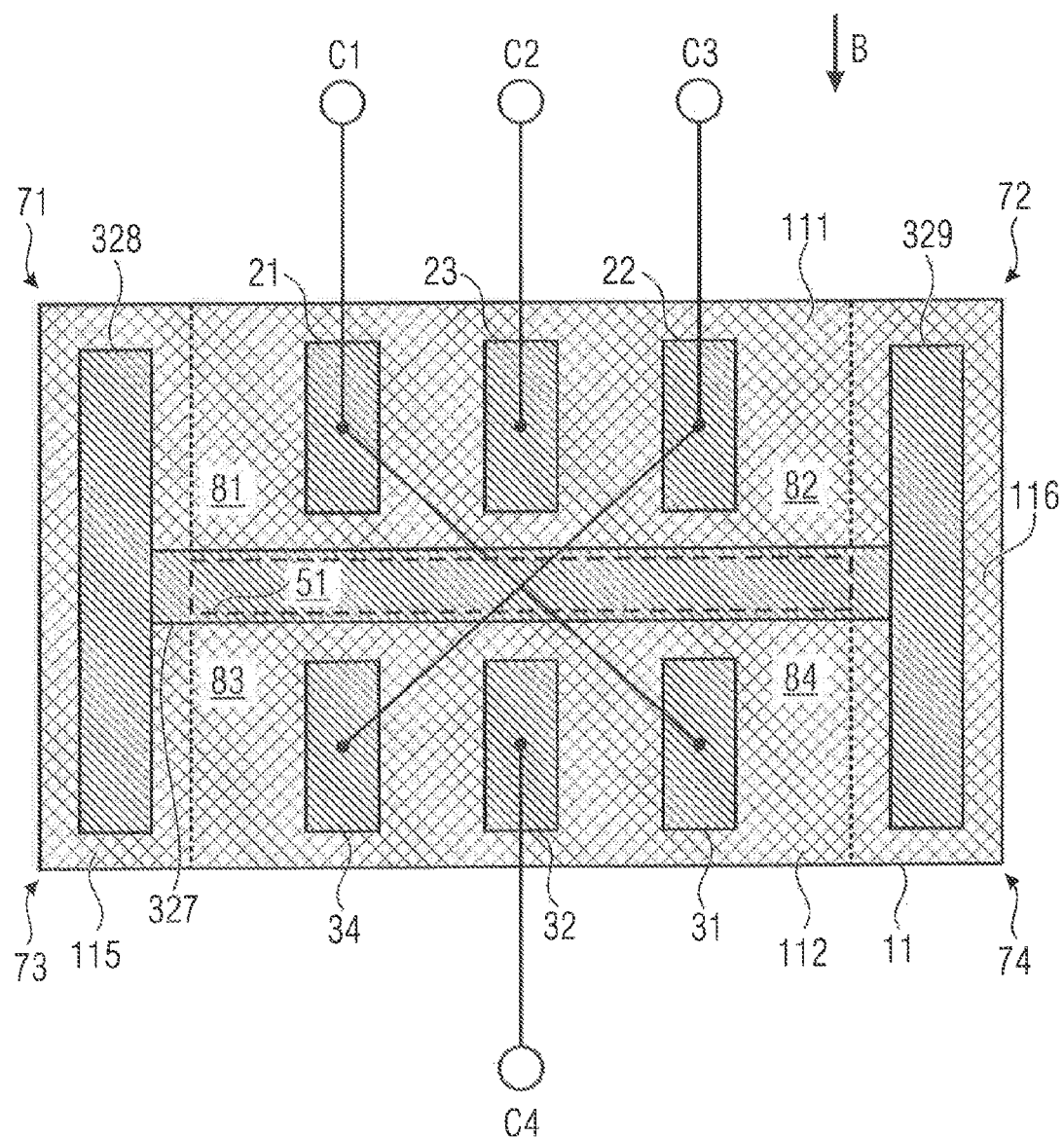
FIG. 6 shows a schematic plan view of a vertical Hall device according to a seventh embodiment.

FIG. 6 shows a schematic plan view of a vertical Hall device according to embodiments which may be regarded as a further development of the embodiments shown in FIG. 3. In the embodiment of FIG. 6 the two outer contacts 328, 329 are connected with a horizontal strip 327 of an electrically conducting material, e.g., a metal. This strip 327 may extend adjacent to the main surface 8 of the semiconductor substrate 10 of the Hall effect region 11. It may in particular cover the separator 51 which is indicated in FIG. 6 by a box drawn in dashed line, as it is below the strip 327. The strip 327 typically makes no contact to the tub(s) 11 or trench(es) 51 below. If the slot 51 needs a contact, a hole typically needs to be provided in the strip 327 to get access to the slot 51 below.

Figure 7:
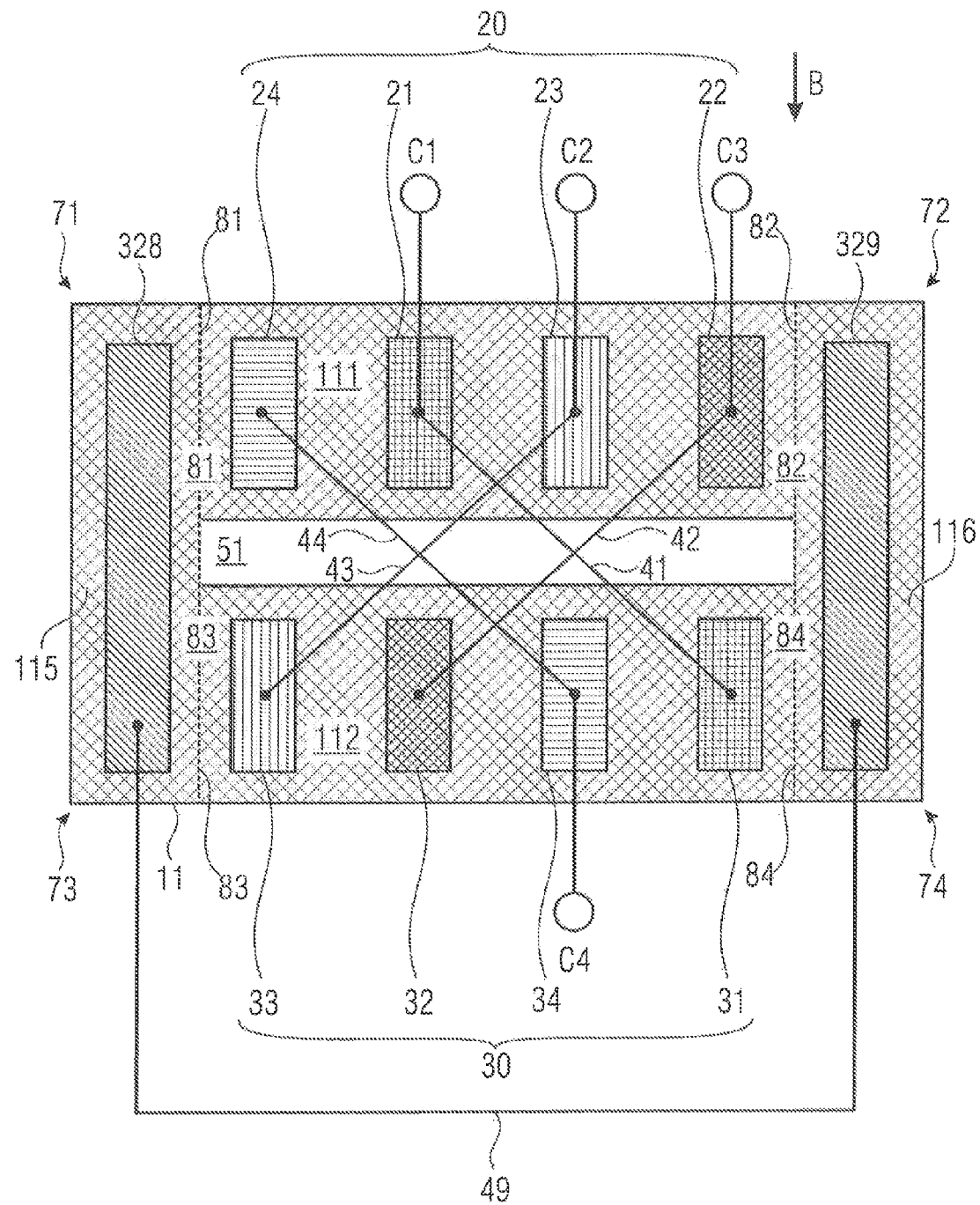
FIG. 7 shows a schematic plan view of a vertical Hall device according to an eight embodiment.

FIG. 7 shows a schematic plan view of a vertical Hall device according to a further embodiment. An even better degree of symmetry may be obtained by adding one contact in the upper and lower branches 111, 112, and thus to the first plurality of contacts 20 and a second plurality of contacts 30. The hatch patterns show that each of the terminals C1 to C4 represents a short circuit of an inner contact and an outer contact so that there is no preferences/asymmetry between the four terminals C1 to C4. In the first plurality of contacts 20 the leftmost contact 24 has been added which is short-circuited via a connection 44 to the contact 34 of the second plurality of contacts 30. In the second plurality of contacts 30 the contact 33 has been added as the leftmost and accordingly as one of the outer contacts. The contact 33 is electrically connected via a connection 43 to the contact 23 of the first plurality of contacts 20.

In FIG. 7 it can be seen that at least one contact of the first plurality of contacts 20 is electrically connected to at least one of:
  a next but one contact of an aligned contact within the second plurality of contacts 30, and
  a preceding but one contact of an aligned contact of the second plurality of contacts 30.

The aligned contact is the contact within the second plurality of contacts 30 that is aligned to the at least one contact of the first plurality of contacts 20. For example, the contact 24 is (pairwise) aligned to the contact 33, and vice versa. The next but one contact of contact 33 is contact 34 within the second plurality of contacts 30. It can be seen that the contacts 24 and 34 are electrically connected via the electrical connection 44. Another example is contact 22 which is (pairwise) aligned to contact 31 of the second plurality of contacts 30. The preceding but one contact of contact 31 is contact 32 within the second plurality of contacts 30. This contact 32 is electrically connected to the contact 22 of the first plurality of contacts 20, via the electrical connection 42.

Figure 8:
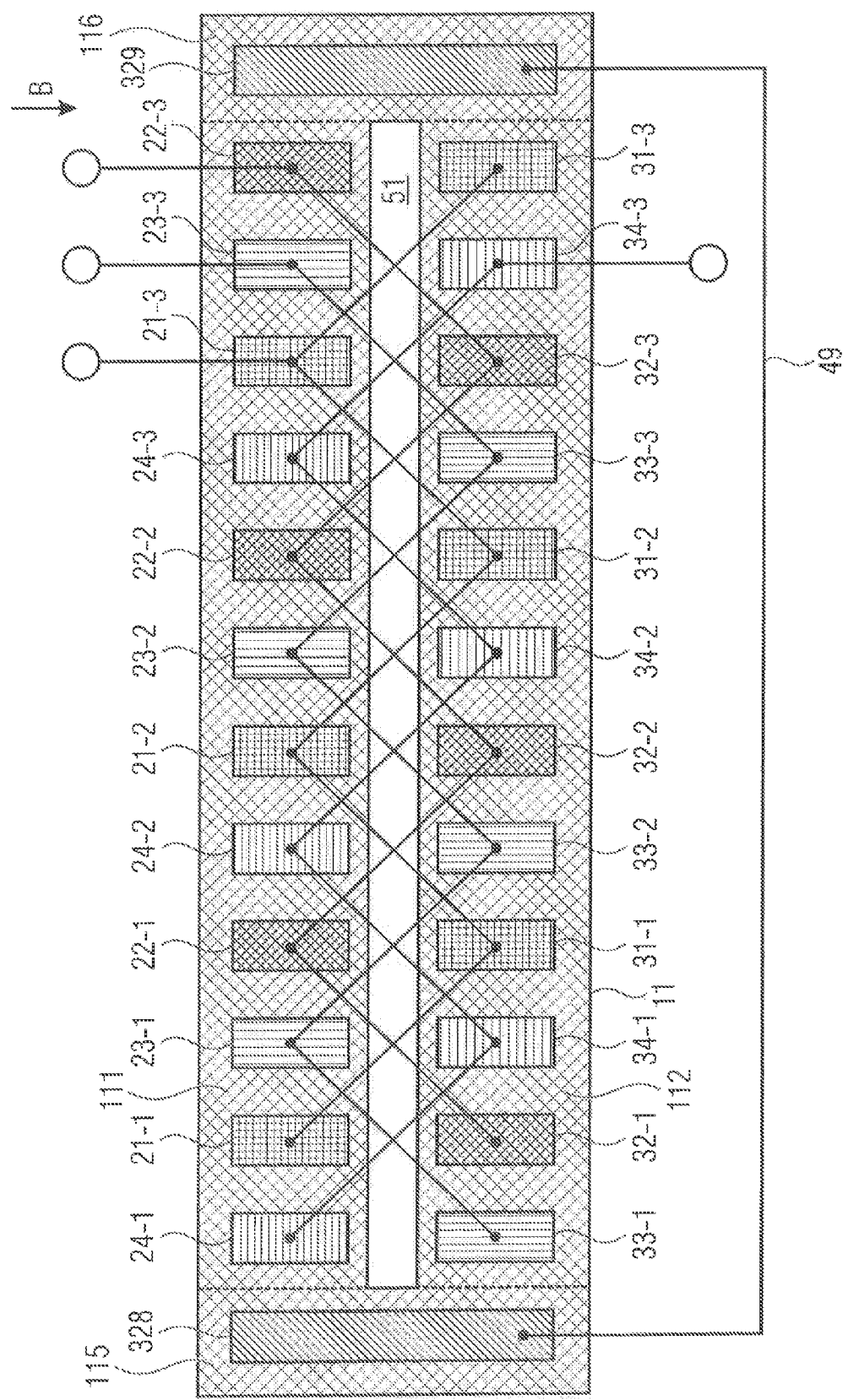
FIG. 8 shows a schematic plan view of a vertical Hall device according to a ninth embodiment.

This scheme may be generalized as schematically illustrated in FIG. 8 which shows a schematic plan view of a vertical Hall device according to a further embodiment. Again, the different hatch patterns indicate which of the contacts are electrically connected to each other. In FIG. 8 it becomes apparent that a particular contact within the first plurality of contacts 20 is connected to those contacts within the first plurality of contacts 20, which are four contacts or a multiple of four contacts away from said contact, if the contacts of the first plurality of contacts 20 are numbered, for example, from left to right in an ascending order. A similar observation can be made for the contacts of the second plurality of contacts 30. Between the first and second plurality of contacts 20, 30 there is, however, an offset of two contacts. This may be expressed as follows: Let m be the index of a particular contact within the first plurality of contacts 20. Let n be an integer with m≥1. Then the contact m is connected to a contact m±4n within the first plurality of contacts under the following boundary condition:

$1 \leq m \pm 4n \leq M$ with M being the number of contacts within the first plurality of contacts. The contact m is also connected to contacts within the second plurality of contacts 30 having an index according to $1 \leq m + 2 \pm 4n \leq N_2$, wherein $N_2$ is the number of contacts within the second plurality of contacts (typically $M_1 = N_2$).

Example: Let M=N=12 as in the embodiment shown in FIG. 8. The contact with the index m=7 (reference numeral 23-2) is connected to contacts #3 (reference numeral 23-1) and #11 (reference numeral 23-3) within the first plurality of contacts 20. The contact with the index m=7 is also connected to the contacts #1 (reference numeral 33-1), #5 (reference numeral 33-2), and #9 (reference numeral 33-3) within the second plurality of contacts 30.

Figure 9:
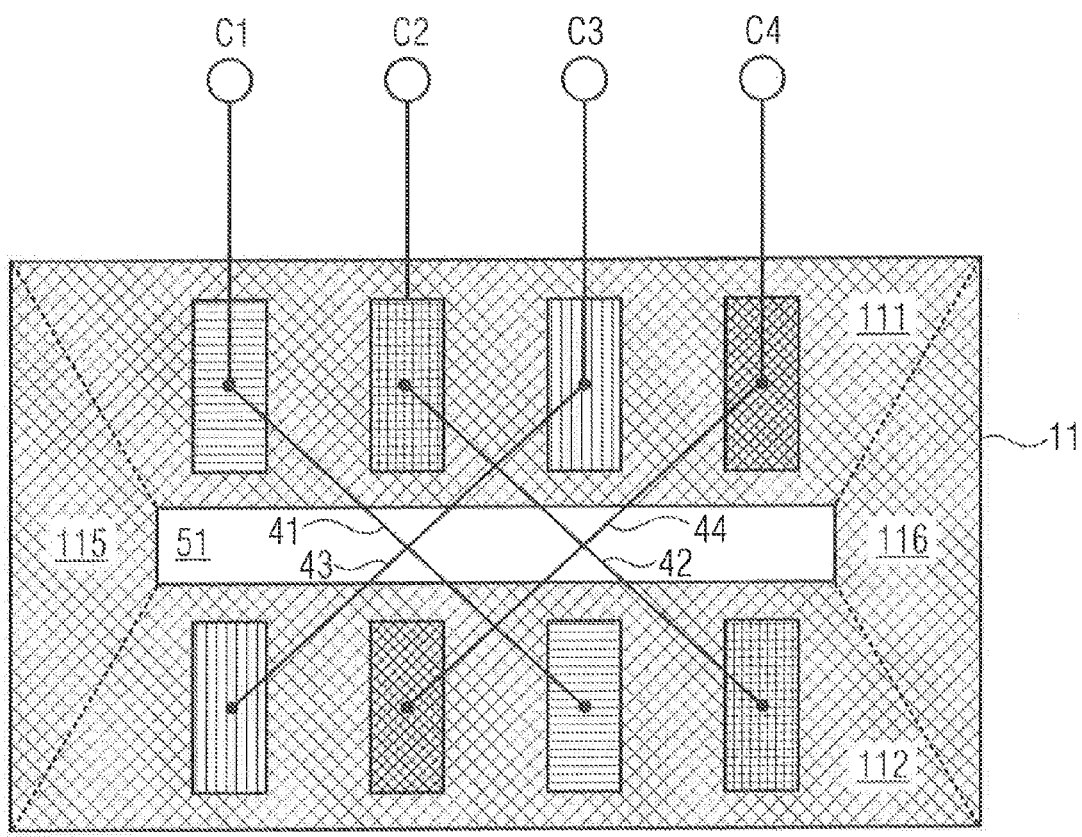
FIG. 9 shows a schematic plan view of a vertical Hall device according to a tenth embodiment.
Figure 10:
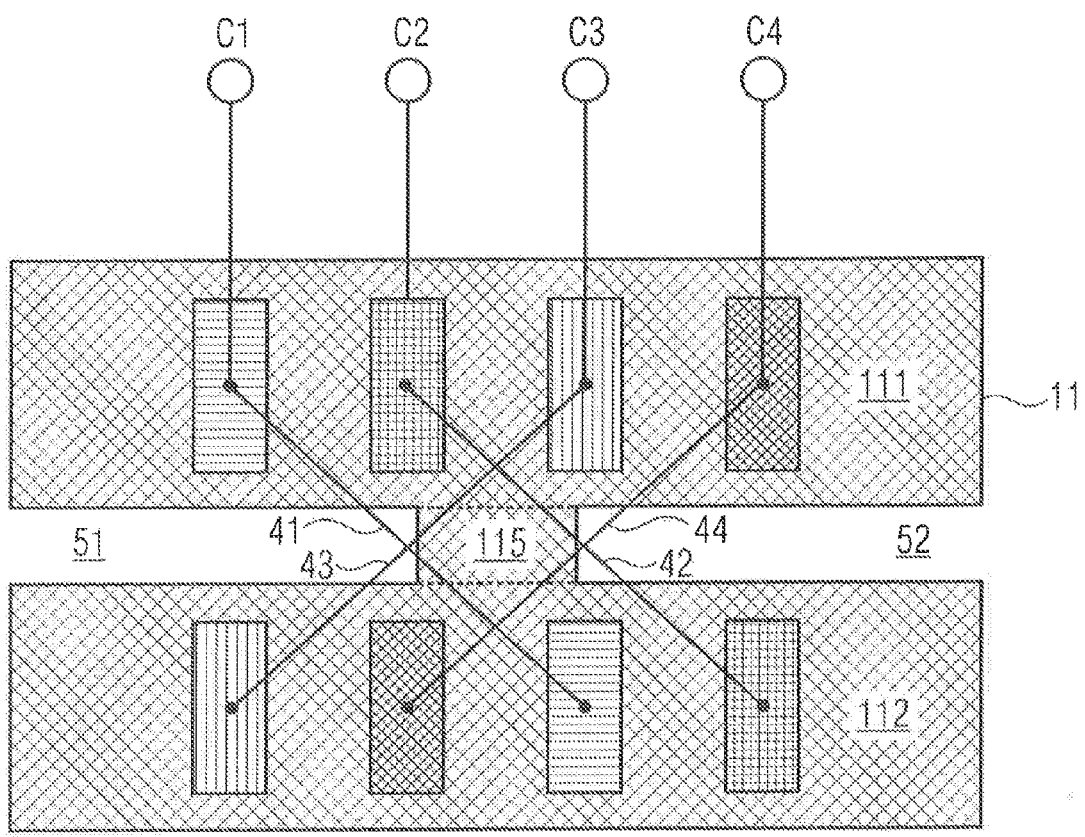
FIG. 10 shows a schematic plan view of a vertical Hall device according to an eleventh embodiment.

FIGS. 9 and 10 show schematic plan views of vertical Hall devices according to two further embodiments ("2×4C devices"). In contrast to other embodiments, there are no electrical connections between a contact in the upper row (first plurality of contacts) and its corresponding aligned contact in the lower row (second plurality of contacts), but only diagonal connections between a contact in the upper row and the next but one contact or the preceding but one contact in the lower row. The vertical Hall device according to FIG. 9 or 10 may be operated using a four-phase spinning current scheme as follows:

|  | positive supply contact | negative supply contact | positive sense contact | negative sense contact |
|---|---|---|---|---|
| clock phase 1 | C1 | C3 | C2 | C4 |
| clock phase 2 | C2 | C4 | C3 | C1 |
| clock phase 3 | C3 | C1 | C4 | C2 |
| clock phase 4 | C4 | C2 | C1 | C3 |

FIG. 9 shows a first option for the separator 51 resulting in an "O"-shape of the Hall effect region 11. Note that during clock phase 1 a portion of the electric current would branch off from the upper contact C1 to the lower contact C3 via connection section 115, thus not producing a Hall signal.

FIG. 10 shows a second option for the separator 51 resulting in an "I"-shape of the Hall effect region 11. With this configuration, current flows from the upper row of contacts to the lower row of contacts are substantially inhibited.

Figure 11:
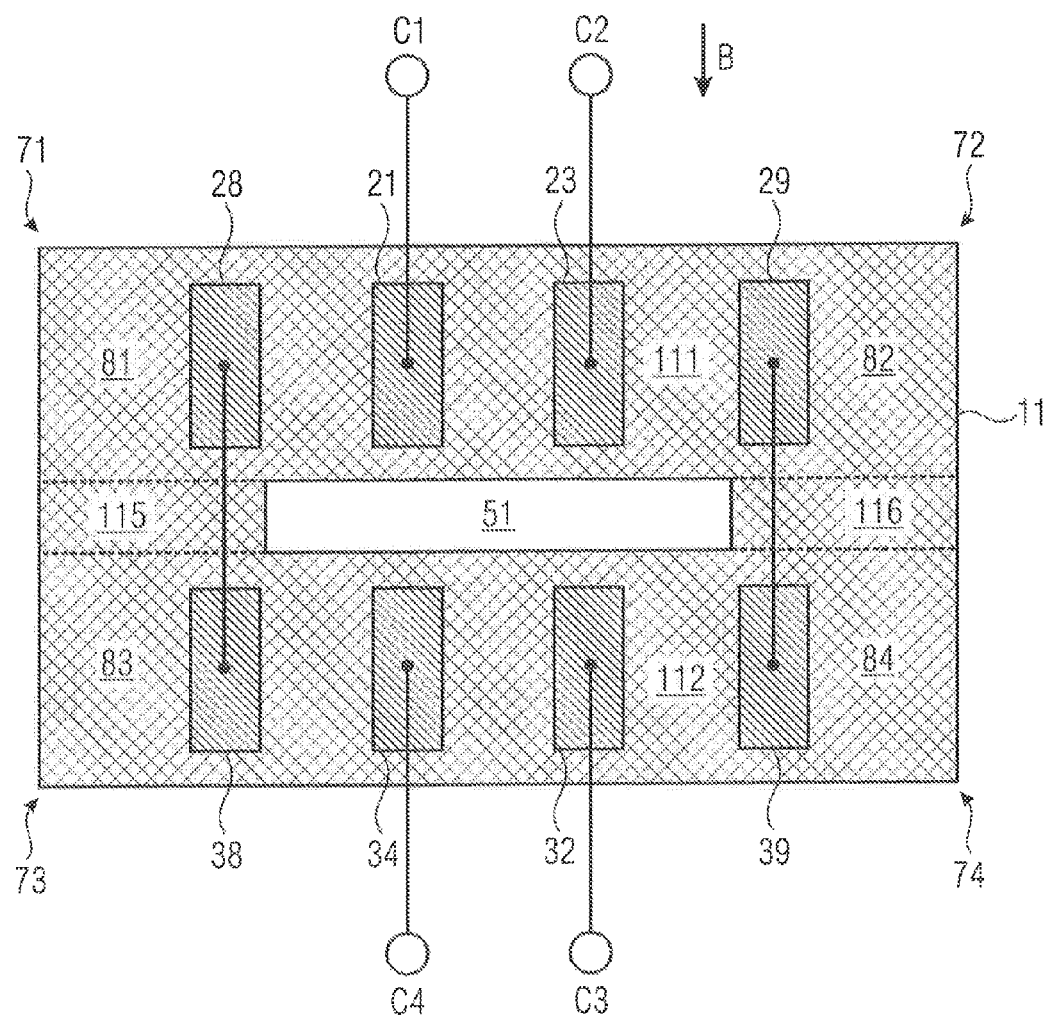
FIG. 11 shows a schematic plan view of a vertical Hall device according to a twelfth embodiment.

FIG. 11 shows a schematic plan view of a vertical Hall device according to a further embodiment which can be obtained from the embodiment shown in FIG. 2A by deleting one contact from the upper and lower branches, i.e., from the first and second straight sections 111 and 112. Furthermore, the diagonal connections 41 and 42 between upper and lower branches in the embodiment of FIG. 2A are also deleted. Once again, it is emphasized that according to embodiments a single Hall effect region 11 is patterned or subdivided into two or more straight sections 111, 112 (if the technology that is used for manufacturing the vertical Hall device provides a buried layer, then this buried layer is typically also patterned identically to the Hall effect region). In contrast, other vertical Hall devices comprise two or more distinct Hall effect regions (each having its own buried layer, if the technology provides a buried layer) which are only electrically connected via contacts at the upper surface of the Hall effect regions in a ring circuit or in another electrical arrangement.

During the first clock phase of the spinning current scheme an electrical current is supplied to the Hall effect region 11 via the contact 21 and extracted from the Hall effect region 11 via the contact 32, for example. Depending on the prevalent magnetic field approximately one half of the electrical current flows to the left after having entered the Hall effect region 11 at the contact 21, through the connecting portion 115 and the left portion of the second straight section 112 until it leaves the Hall effect region 11 at the contact 32. The remaining electrical current (again, approximately the half of the entire electrical current) first flows to the right within the first straight section 111, then through the further connecting section 116 and then to the left until it leaves the Hall effect region 11 at contact 32, as well. From an electrical point of view the Hall effect region 11 can be regarded as a parallel connection between contacts 21 and 32 of two substantially identical resistances. The first resistance represents the portion of the Hall effect region 11 relative to the "counter-clockwise" current flow between contacts 21 and 32 (i.e., via connecting section 115). The second resistance represents that portion of the Hall effect region 11 relative to the "clockwise" current flow direction between contact 21 and 32 (i.e. via the further connecting section 116).

Note that in FIG. 11 the boundaries between the first and second straight sections 111, 112 and the connecting section 115 and the further connecting section 116 are assumed to be different. However, this is only to demonstrate that the short circuit contacts 28, 29, 38, 39 may be regarded as being arranged in or at the surface of the first/second straight sections 111, 112, respectively. Furthermore, it is pointed out that there is no electrical connection between the left short circuit contacts 28, 38 and the right short circuit contacts 29, 39. Nevertheless, such an electrical production could be provided in alternative embodiments.

During the first clock phase, sense signals may be obtained at contacts 23 and 34. During a second clock phase of the spinning current scheme, the contacts 23 and 34 act as supply contacts. In exchange, the contacts 21 and 32 act as sense contacts.

Figure 12:
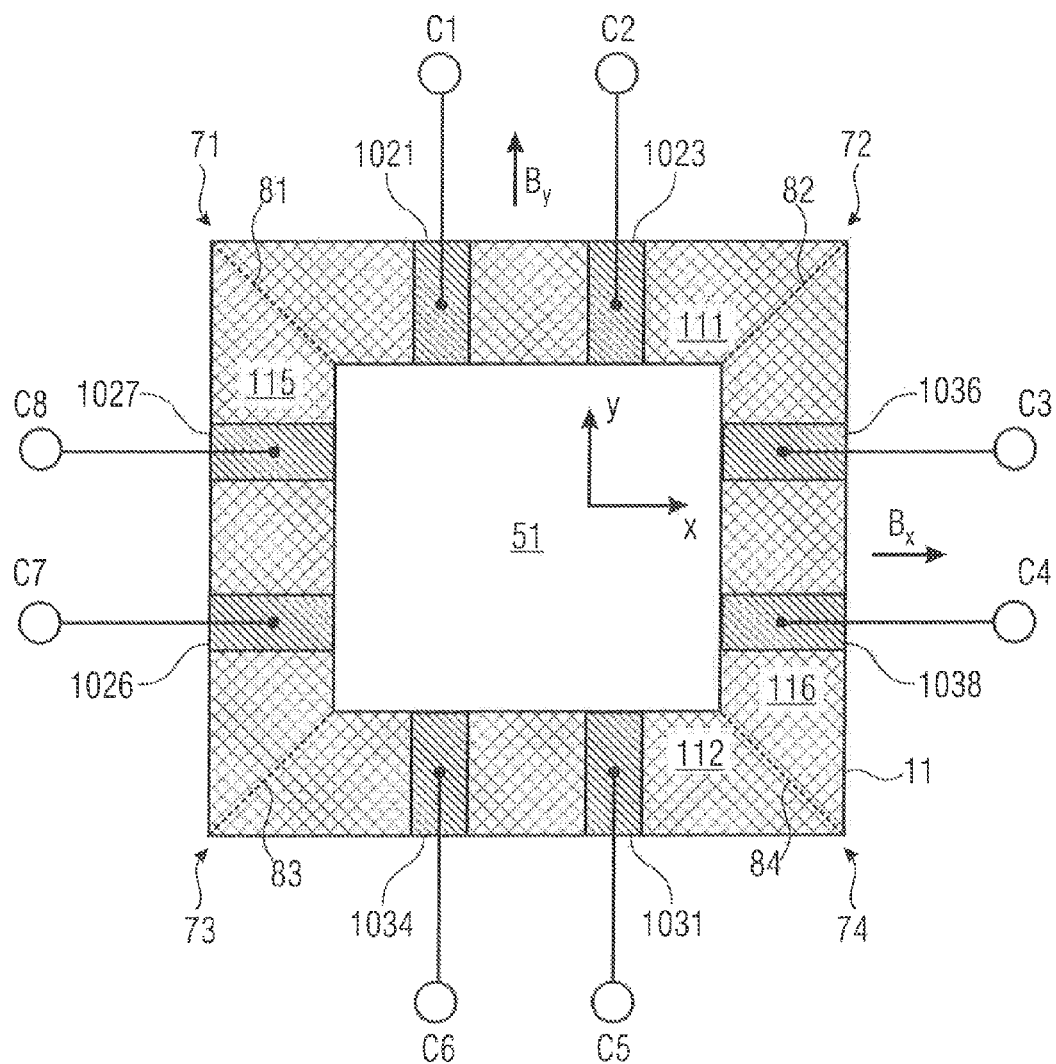
FIG. 12 shows a schematic plan view of a vertical Hall device according to a thirteenth embodiment.

FIG. 12 shows a schematic plan view of a vertical Hall device according to further embodiments. In comparison to other embodiments (e.g. the embodiment according to FIG. 11) the embodiment according to FIG. 12 may be obtained by making the slot 51 wider in order to have a square aperture. No short circuit contacts 28, 29, 38, 39 are present in the embodiment according to FIG. 12 (although it would be possible to place then in the four corners of the ring structure). Instead, two further contacts 1026 and 1027 are added at the left of this ring structure, in particular in or at the surface of the connecting section 115. Two other contacts 1036 and 1038 are also added at the right of this ring structure, in particular in or at the surface of the further connecting portion 116. The connecting section 115 and the further connecting section 116 are substantially identical (except for a 90 degree rotation) to the first and second straight sections 111, 112. In particular, the connecting section 115 and the further connecting section 116 are straight sections that have the same length as the first straight section 111 and the second straight section 112. They are oriented orthogonally to the first straight section 111 and the second straight section 112 so that the Hall effect region 11 has a square shape with the separator 51 being rectangular (in the embodiment according to FIG. 12 it is even square, as well) and located between the first straight section 111, the second straight section 112, the connecting section 115, and the further connecting section 116. The contacts 1026 and 1027 form a third plurality of contacts which is arranged in or at the surface of the connecting section 115. The third plurality of contacts is distanced from a first end 81 and a second end 83 of the connecting section 115. The contacts 1036 and 1038 form a fourth plurality of contacts arranged in or at a surface of the further connecting section 116, distanced from a first end 82 and a second end 84 of the further connecting section 116.

In other words, the vertical Hall device of the embodiment according to FIG. 12 can be described as having a Hall effect region of square shape and the slot 51 being located at a center of the Hall effect region 11. The first, second, third, and fourth pluralities of contacts have a rotational symmetry with respect to contact locations and contact functions as supply contacts and sense contacts during the first clock phase of the spinning current scheme. Typically, this rotational symmetry is also maintained during a second clock phase and potential further clock phases of the spinning current scheme, yet with different contact functions for the individual contacts. As mentioned above, the rotational symmetry of the contact functions typically relates to whether the contacts in question function as supply contacts or sense contacts, in general, but not to the exact electrical connection (e.g., "positive supply contact" vs. "negative supply contact") of these contacts.

With the vertical Hall device shown in FIG. 12 it is possible to measure magnetic fields parallel to the y-direction by means of terminals C1, C2, C5, and C6. Magnetic fields in the x-direction may be measured by means of terminals C3, C4, C7, and C8.

The vertical Hall device according to FIG. 12 may be operated in the following way: in a first clock cycle positive supply is connected to terminals C1 and C5. Negative supply is connected to terminals C3 and C7. The terminals C2 and C6 function as sense terminals indicative of the y-component of the magnetic field $B_y$, whereas the terminals C4 and C8 function as sense terminals for the x-component of the magnetic field $B_x$.

In a second clock cycle the supply and sense terminals are swapped.

The x-component of the magnetic field $B_x$ is computed by adding/subtracting the signals C4-C8 of the first clock cycle and signals C3-C7 of the second clock cycle.

The y-component of the magnetic field $B_y$ is computed by adding/subtracting signals C2-C6 of the first clock cycle and signals C1-C5 of the second clock cycle.

The region inside the aperture can be used for circuitry or, e.g., a conventional Hall plate (that detects magnetic field components vertical to the die surface (substrate surface)). The vertical Hall device illustrated in FIG. 12 is very symmetric. Note that in the embodiment according to FIG. 12 the contacts are in the four branches or straight sections of the Hall effect region 11, whereas other vertical Hall effect devices with a square, ring-shaped Hall effect region may have the contacts in the corners 71 to 74 of the device. The embodiment according to FIG. 12 also makes apparent that, for example, the first plurality of contacts may have as few as two contacts, namely the contact 1021 (a supply contacted during the first clock phase) and the contact 1023 (a sense contact during the first clock phase). Due to the 90° rotational symmetry of the device, this is also true for the second, third, and fourth pluralities of contacts. In other words, the i-th plurality of contacts may comprise at least two contacts. Or, the i-th plurality of contacts may comprise at least a supply contact for the first clock phase and a sense contact for the first clock phase.

Yet another way to pattern the Hall effect region 11 is obtained by inverting the "O"-Hall effect region 11 of FIGS. 2 to 9 to an "I"-Hall effect region, as, for example, illustrated in FIGS. 1A-1G.

Figure 13:
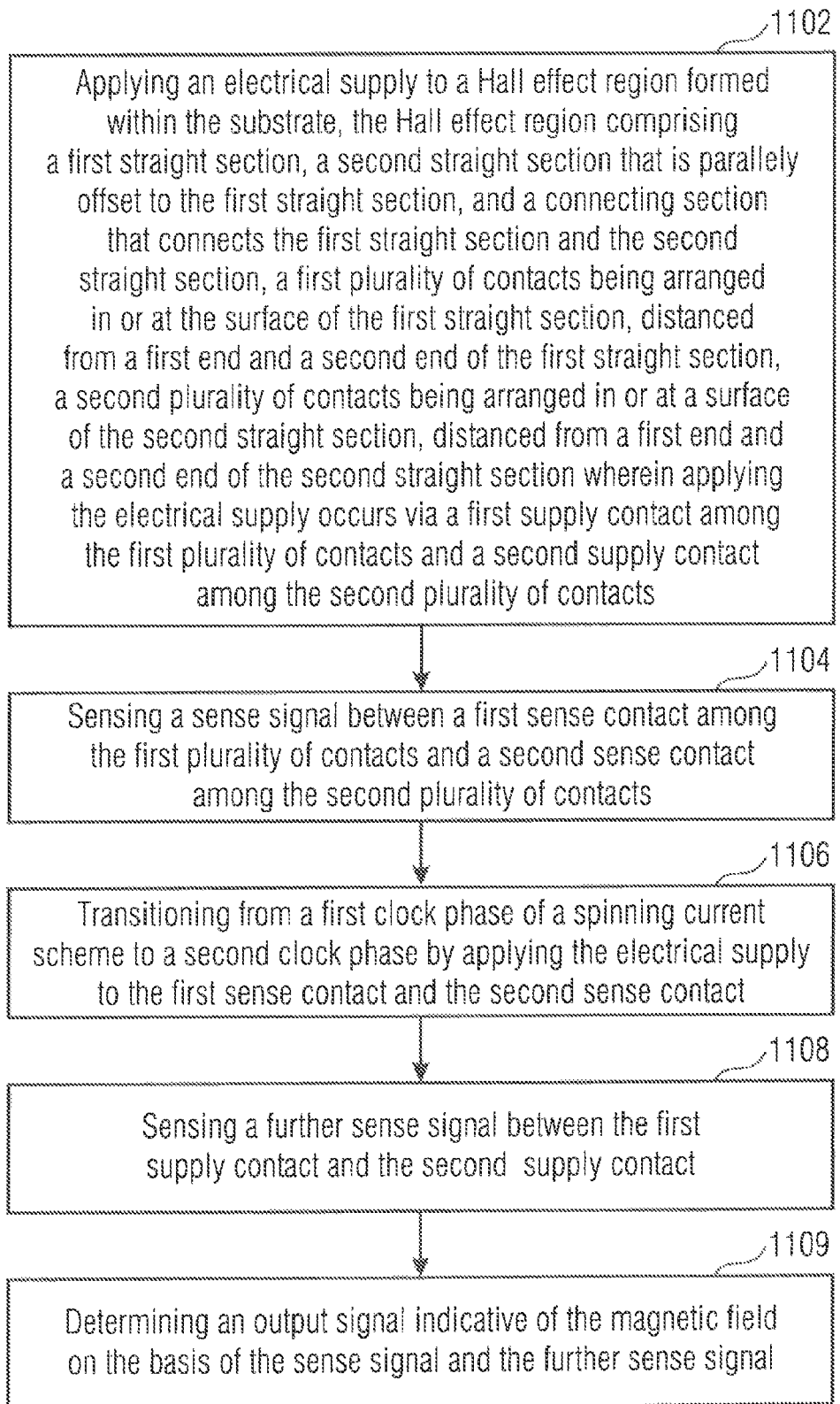
FIG. 13 shows a schematic flow diagram of a sensing method according to an embodiment.

FIG. 13 shows a schematic flow diagram of a sensing method according to embodiments. The method comprises a step 1102 of applying an electrical supply to a Hall effect region that is formed within a substrate, typically a semiconductor substrate. The Hall effect region comprises a first straight section, a second straight section that is offset parallel to the first straight section, and a connecting section that connects the first straight section and the second straight section. In some embodiments the Hall effect region may also comprise a further connecting section, leading to a ring-shaped Hall effect region. A first plurality of contacts is arranged in or at the surface of the first straight section. This first plurality of contacts is distanced from a first end and also from a second end of a first straight section. A second plurality of contacts is arranged in or at a surface of the second straight section, distanced from a first end and a second end of the second straight section. Applying the electrical supply occurs via a first supply contact among the first plurality of contacts and a second supply contact among the second plurality of contacts. Typically, an electrical supply current is fed to the Hall effect region via the first supply contact and extracted from the Hall effect region at the second supply contact, or vice versa. The sensing method is typically intended to be performed in connection with a vertical Hall device that is suited for the so-called spinning current scheme. Accordingly, the step 1102 and also the subsequent step 1104 which will be described next relate to a first clock phase of the spinning current scheme.

During the step 1104 a sense signal is sensed between a first sense contact among the first plurality of contacts and a second sense contact among the second plurality of contacts. In particular in the presence of a magnetic field component parallel to the substrate surface and perpendicular to a net current flow direction between the first supply contact and the second supply contact, the first sense contact and the second sense contact will typically be at different electrical potentials, (mainly) due to the Hall effect. This difference of electrical potential can be measured or sensed, thus providing the sense signal. Other options for obtaining the sense signal are also possible, such as measuring an electrical current or a difference of electrical currents that flow through the first and second sense contacts.

During a step 1106 a transition from the first clock phase of the spinning current scheme to a second clock phase is performed by applying the electrical supply to the first sense contact and the second sense contact. As an alternative, the supply to the first and second supply contacts which were used as supply contacts during the first clock phase, may be interrupted, and another supply for the first and second sense contacts (during the first clock phase) is activated for the second clock phase. In other words, the functions of the supply contacts and the sense contacts are interchanged by transitioning from the first clock phase to the second clock phase.

Step 1108 is the sensing step during the second clock phase so that a further sense signal is sensed between the first (former) supply contact and the second (former) supply contact.

Finally, an output signal that is indicative of the magnetic field on the basis of the sense signal and the further sense signal is determined at a step 1109.

This sensing method may basically be performed with any of the vertical Hall devices shown in and described in connection with FIGS. 1A to 12. Accordingly, specific details of the vertical Hall devices described above may also be used for further defining the sensing method as outlined in the flow diagram of FIG. 13. The same remark is also true for the schematic flow diagram of FIG. 14 which also relates to a sensing method, however according to different embodiments.

Figure 14:
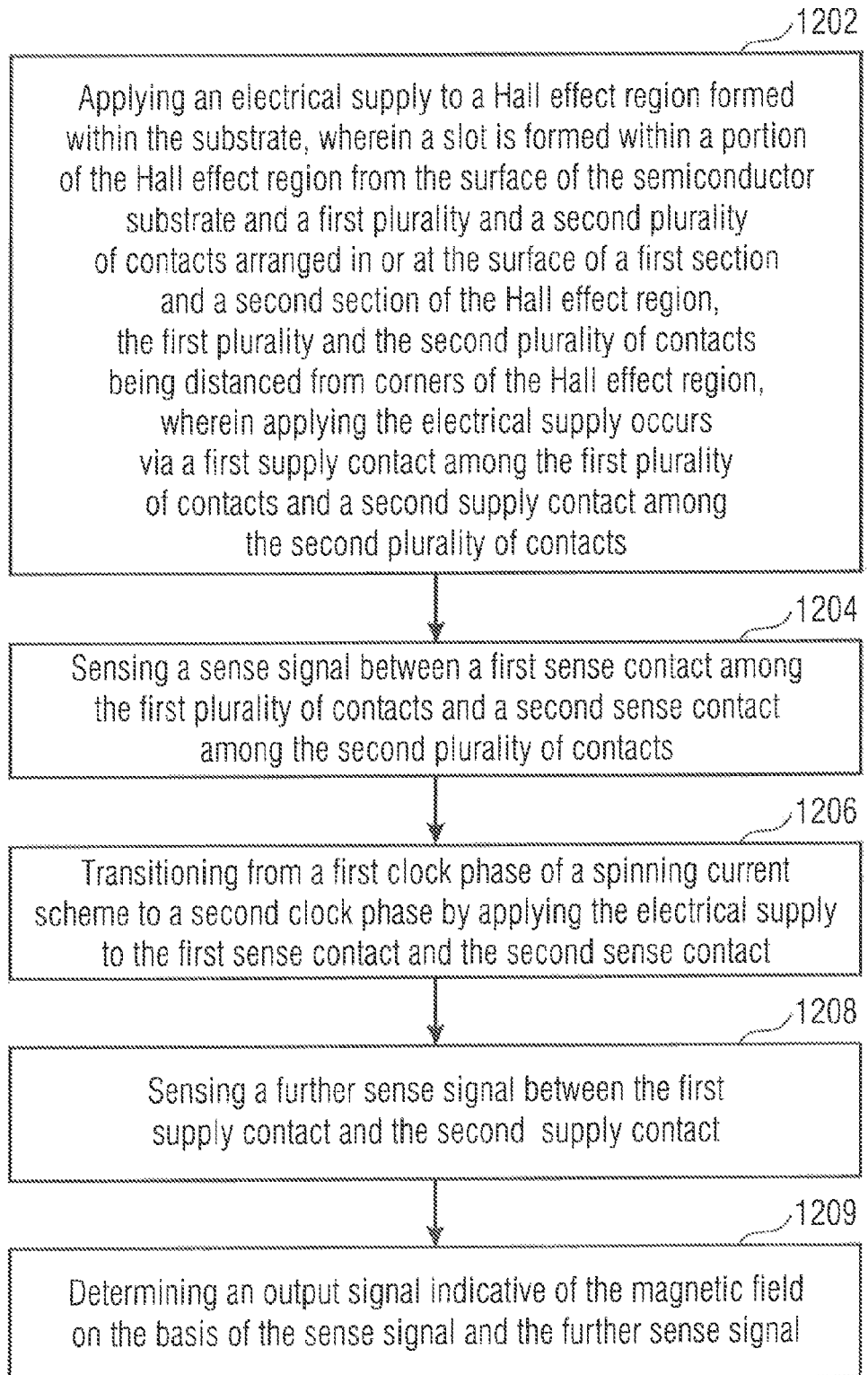
FIG. 14 shows a schematic flow diagram of a sensing method according to another embodiment.

In the schematic flow diagram of FIG. 14, an electrical supply is supplied to a Hall effect region during a step 1202. The Hall effect region is formed within a substrate, typically a semiconductor substrate. A slot is formed within a portion of the Hall effect region, typically from the surface of the substrate. In alternative embodiments the slot may also be formed within the semiconductor substrate by means of appropriate manufacturing techniques. A first plurality and a second plurality of contacts are arranged in or at the surface of a first section and a second section of the Hall effect region, respectively. The first plurality and the second plurality of contacts are distanced from corners of the Hall effect region. Applying the electrical supply occurs via a first supply contact among the first plurality of contact and a second supply contact among the second plurality of contacts.

At a step 1204 a sense signal is sensed between a first sense contact among the first plurality of contacts and a second sense contact among the second plurality of contacts.

A transition from a first clock phase of a spinning current scheme to a second clock phase is performed at step 1206. Accordingly, the electrical supply is applied to the first sense contact and the second sense contact. Alternative options as discussed above in connection with step 1106 may also be used here.

At a step 1208 a further sense signal is sensed between the first supply contact and the second supply contact. Then an output signal indicative of the magnetic field is determined on the basis of the sense signal and the further sense signal.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A vertical Hall device comprising:
   a Hall effect region that comprises a first straight Hall effect section, a second straight Hall effect section that is offset from and parallel to the first straight Hall effect section, wherein the first straight Hall effect section and the second straight Hall effect section comprise projections connected to each other defining at least one connecting section that connects the first straight Hall effect section and the second straight Hall effect section;
   a separator that separates a portion of the first straight Hall effect section from a portion of the second straight Hall effect section;
   a first plurality of contacts arranged in or at a surface of the first straight Hall effect section; and
   a second plurality of contacts arranged in or at a surface of the second straight Hall effect section,
   wherein the vertical Hall device is operable during a first clock phase of a spinning current scheme such that the first plurality of contacts comprises a first supply contact and a first sense contact, wherein the second plurality of contacts comprises a second supply contact and a second sense contact,
   wherein the vertical Hall device is disposed in a semiconductor substrate, and wherein the at least one connecting section comprises the semiconductor substrate.

2. The vertical Hall device according to claim 1, wherein the first plurality of contacts is distanced from a first end and a second end of the first straight Hall effect section, and wherein the second plurality of contacts is distanced from a first end and a second end of the second straight Hall effect section.

3. The vertical Hall device according to claim 1, wherein the first plurality of contacts and the second plurality of contacts are pair-wise aligned to each other along a direction defined by a parallel offset of the first straight Hall effect section and the second straight Hall effect section.

4. The vertical Hall device according to claim 3, wherein at least one supply contact of the first plurality of contacts is aligned with a supply contact of the second plurality of contacts, and wherein at least one sense contact of the first plurality of contacts is aligned with a sense contact of the second plurality of contacts.

5. The vertical Hall device according to claim 3, wherein at least one supply contact of the first plurality of contacts is aligned with a sense contact of the second plurality of contacts, and wherein at least one sense contact of the first plurality of contacts is aligned with a supply contact of the second plurality of contacts.

6. The vertical Hall device according to claim 1, wherein the first straight Hall effect section and the second straight Hall effect section comprise further projections connected to each other defining a further connecting section that connects the first straight Hall effect section and the second straight Hall effect section so that the first straight Hall effect section, the second straight Hall effect section, the connecting section and the further connecting section form a frame for the separator.

7. The vertical Hall device according to claim 6, further comprising:

a third plurality of contacts arranged in or at the surface of the connecting section, distanced from a first end and a second end of the connecting section; and a fourth plurality of contacts arranged in or at a surface of the further connecting section, distanced from a first end and a second end of the further connecting section.

8. The vertical Hall device according to claim 7, wherein the connecting section and the further connecting section are straight sections, that have the same length as the first straight Hall effect section and the second straight Hall effect section and are oriented orthogonally to the first straight Hall effect section and the second straight Hall effect section so that the Hall effect region has a square shape with the separator being rectangular and located between the first straight Hall effect section, the second straight Hall effect section, the connecting section, and the further connecting section, and wherein the first, second, third, and fourth plurality of contacts have a rotational symmetry with respect to contact locations and contact functions as supply contacts and sense contacts during the first clock phase of the spinning current scheme.

9. The vertical Hall device according to claim 6, further comprising a plurality of short circuit contacts arranged in or at the surfaces of the connecting section and the further connecting section, wherein the short circuit contacts are electrically connected to a single network node.

10. The vertical Hall device according to claim 1, wherein Hall effect region is n-doped, and wherein the separator comprises one out of the group consisting of an empty space, a trench insulation, a dielectric insulation, and a p-doped region being reverse biased to the Hall effect region.

11. The vertical Hall device according to claim 1, wherein Hall effect region is p-doped, and wherein the separator comprises a selected one out of the group consisting of an empty space, a trench insulation, a dielectric insulation, an n-doped region being reverse biased to the Hall effect region.

12. A vertical Hall device comprising:
a Hall effect region that comprises a first straight Hall effect section, a second straight Hall effect section that is offset from and parallel to the first straight Hall effect section, wherein the first straight Hall effect section and the second straight Hall effect section comprise projections connected to each other defining at least one connecting section that connects the first straight Hall effect section and the second straight Hall effect section;
a separator that separates a portion of the first straight Hall effect section from a portion of the second straight Hall effect section;
a first plurality of contacts arranged in or at a surface of the first straight Hall effect section; and
a second plurality of contacts arranged in or at a surface of the second straight Hall effect section,
wherein the vertical Hall device is operable during a first clock phase of a spinning current scheme such that the first plurality of contacts comprises a first supply contact and a first sense contact, wherein the second plurality of contacts comprises a second supply contact and a second sense contact, and
wherein the first straight Hall effect section and the second straight Hall effect section comprise further projections connected to each other defining a further connecting section that connects the first straight Hall effect section and the second straight Hall effect section so that the first straight Hall effect section, the second straight Hall effect section, the connecting section and the further connecting section form a frame for the separator.

13. The vertical Hall device according to claim 12, further comprising:
a third plurality of contacts arranged in or at the surface of the connecting section, distanced from a first end and a second end of the connecting section; and
a fourth plurality of contacts arranged in or at a surface of the further connecting section, distanced from a first end and a second end of the further connecting section.

14. The vertical Hall device according to claim 13, wherein the connecting section and the further connecting section are straight sections, that have the same length as the first straight Hall effect section and the second straight Hall effect section and are oriented orthogonally to the first straight Hall effect section and the second straight Hall effect section so that the Hall effect region has a square shape with the separator being rectangular and located between the first straight Hall effect section, the second straight Hall effect section, the connecting section, and the further connecting section, and wherein the first, second, third, and fourth plurality of contacts have a rotational symmetry with respect to contact locations and contact functions as supply contacts and sense contacts during the first clock phase of the spinning current scheme.

15. The vertical Hall device according to claim 12, further comprising a plurality of short circuit contacts arranged in or at the surfaces of the connecting section and the further connecting section, wherein the short circuit contacts are electrically connected to a single network node.

* * * * *